United States Patent
Harada et al.

(10) Patent No.: US 6,283,835 B1
(45) Date of Patent: Sep. 4, 2001

(54) METHOD AND APPARATUS FOR MANUFACTURING A SEMICONDUCTOR INTEGRATED CIRCUIT

(75) Inventors: Shigeru Harada; Takashi Yamashita; Noriaki Fujiki; Tsutomu Tanaka, all of Itami (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/727,539

(22) Filed: Dec. 4, 2000

Related U.S. Application Data

(62) Division of application No. 08/457,686, filed on Jun. 1, 1995.

(30) Foreign Application Priority Data

Dec. 6, 1994 (JP) .................................................. 6-302377

(51) Int. Cl.[7] .................................................. B24B 1/00
(52) U.S. Cl. .................. 451/41; 451/63; 451/36
(58) Field of Search .................. 451/41, 28, 8, 451/9, 63, 36, 40, 60, 283, 285, 287, 397, 398, 446; 134/1.3, 2, 37, 201, 184; 156/656.1; 438/696, 754, 906, 963

(56) References Cited

U.S. PATENT DOCUMENTS

| | | |
|---|---|---|
| 3,801,391 | 4/1974 | Dyment et al. . |
| 3,883,219 | 5/1975 | Logan et al. . |
| 4,064,885 * | 12/1977 | Dussault et al. .................... 134/58 R |
| 4,178,188 * | 12/1979 | Dussault et al. .......................... 134/1 |

(List continued on next page.)

FOREIGN PATENT DOCUMENTS

| | | |
|---|---|---|
| 195 25 521 | 3/1996 | (DE) . |
| 5-152268 | 6/1993 | (JP) . |
| 5-203166 | 8/1993 | (JP) . |
| 6-116756 | 4/1994 | (JP) . |
| 7-58198 | 3/1995 | (JP) . |

OTHER PUBLICATIONS

G. Schumicki and P. Seegebrecht: Prozeβtechnologie. Springer, 1991, pp. 321–325.

"Native Oxide Growth and Organic Impurity Removal on Si Surface with Ozone–Injected Ultrapure Water", by Ohmi et al., J. Electrochem. Soc., vol. 140, No. 3, pp. 804–810.

"Particle Removal Efficiency from Native Oxides Using Dilute SC–1 Megasonic Cleaning"by Cohen et al., Proceedings of the Second Int'l Symp. on Ultra Clean Processing of Si Surfaces, Heyns, M. ed., Bruges, Belgium, p. 35.

"A Double Level Metallization System Having 2μm Pitch for Both Levels" by Doan et al., Philips Research Laboratories, Jun. 13–14, 1988 V–MIC Conf., CH–2624–5/88/0000–0013, pp. 13–20.

"Submicron Wiring Technology with Tungsten and Planarization" by Kaanta et al., IBM General Technology Division, Jun. 13–14, 1988 V–MIC Conf., CH–2624–5/88/0000–0021, pp. 21–28.

"The Equipment Washing Apparatus" by Hirai, Monthly Semiconductor World, Aug. 1993, pp. 138–142.

"Multiobjective Washing Method by Means of $H_2SO_4$/$H_2O_2$HF Solution" by Ohnishi et al., Monthly Semiconductor World, Nov. 1993, pp. 26–28.

*Primary Examiner*—Derris H. Banks
(74) *Attorney, Agent, or Firm*—McDermott, Will & Emery

(57) ABSTRACT

A method and an apparatus for manufacturing a semiconductor integrated circuit in which semiconductor elements (2) and a wiring structure connecting the semiconductor elements (2) one another are located on a semiconductor substrate (1). In the method or apparatus, a series of wiring elements (4,6,7,9,10), each of which constructs the wiring structure, is formed sequentially, then the semiconductor integrated circuit under manufacturing process is washed by neutral solution containing oxidant during the process of forming of the wiring elements (4,6,7,9,10).

11 Claims, 18 Drawing Sheets

U.S. PATENT DOCUMENTS

| | | |
|---|---|---|
| 4,267,012 | 5/1981 | Pierce et al. . |
| 4,381,215 | 4/1983 | Reynolds et al. . |
| 4,736,759 * | 4/1988 | Coberly et al. ......................... 134/66 |
| 4,787,958 | 11/1988 | Lytle . |
| 4,808,259 | 2/1989 | Jillie, Jr. et al. . |
| 4,814,293 | 3/1989 | Van Oekel . |
| 4,863,561 * | 9/1989 | Freeman et al. ..................... 156/646 |
| 4,899,767 | 2/1990 | McConnell et al. . |
| 5,071,776 | 12/1991 | Matsushita et al. . |
| 5,081,068 | 1/1992 | Endo et al. . |
| 5,302,311 | 4/1994 | Sugihara et al. . |
| 5,350,428 | 9/1994 | Leroux et al. . |
| 5,464,480 | 11/1995 | Matthews . |
| 5,505,785 * | 4/1996 | Ferrell ....................................... 134/1 |
| 5,554,254 | 9/1996 | Huang et al. . |
| 5,726,078 | 3/1998 | Razeghi . |
| 6,167,583 * | 1/2001 | Miyashita et al. ....................... 15/77 |
| 6,178,972 * | 1/2001 | Harada et al. ........................ 134/1.3 |

* cited by examiner

METHOD AND APPARATUS FOR MANUFACTURING A SEMICONDUCTOR INTEGRATED CIRCUIT

This application is a Div of Ser. No. 08/457,686 filed Jun. 1, 1995.

FIELD OF THE INVENTION

The present invention relates to a method and an apparatus for manufacturing a semiconductor integrated circuit, and more particularly, to a technique for reducing occurrence of wiring defects in the semiconductor integrated circuit during the process of forming a wiring structure, so as to elevate the quality level of the wiring structure and consequently the quality level of the semiconductor integrated circuit, thus to elevate the productivity of the semiconductor integrated circuit.

DESCRIPTION OF THE PRIOR ART

In a semiconductor integrated circuit, generally, semiconductor elements such as transistors etc. are formed on a semiconductor substrate, and also a wiring structure which connects the semiconductor elements one another or connects the semiconductor elements to external circuits is formed on the semiconductor substrate.

Conventionally, as the wiring structure as mentioned above, there has been used widely a wiring structure in which wiring patterns comprised of a polycrystalline silicon film, a high melting metal film, a high melting metal silicide film, a high melting metal polycide film, an aluminum film or an aluminum alloy film are combined. Recently among those, a high melting metal wiring, in which a tungsten wiring (W wiring) is typical one, has been used widely, since it has low resistance as compared with a polycrystalline silicon wiring pattern or a high melting metal polycide wiring pattern, also has generally good ability for step-coverage of the high melting metal film during a deposition process by means of the chemical vapor deposition method (the CVD method), and further has good reliability such as durability of electro-migration as compared with an aluminum wiring.

Further, as a fine contact member which connects the wiring pattern to the semiconductor substrate or to another lower wiring pattern, there has been used widely such a plug contact that is formed by filling a contact hole linked to the semiconductor substrate or to the lower wiring pattern, with a high melting metal film formed by the above-mentioned CVD method having good ability for step-coverage, for the purpose of reducing the contact resistance of the contact member, or elevating the reliability of the contact member. So there has been used widely a wiring structure which is entirely comprised of combination of the plug contacts and the wiring patterns.

On the other hand it is indispensable to elevate wiring density of the semiconductor integrated circuit for the purpose of achieving high integration and high functionality of the semiconductor integrated circuit. Therefore it is required to reduce the wiring pitch as possible as it can. Thus, as one of methods to be able to elevate the substantial wiring density extremely, a multi-layer type wiring structure also has been used.

Moreover the conventional wiring structures as mentioned above have been disclosed, for instance, in the documents of "A Double Level Metallization System Having 2 μm Pitch for Both Level", T.Doan et. al., pp.13–20, VMIC Conference, 1988, and "SUBMICRON WIRING TECHNOLOGY WITH TUNGSTEN AND PLANARIZATION", C. Kaanta et. al., pp.21–28, VMIC Conference, 1988.

However according to the conventional manufacturing methods of the wiring structure, there have been such problems that debris or residues formed in the wiring forming process often cause wiring defects, so that the quality level of the wiring structure and consequently the quality of the semiconductor integrated circuit are reduced, or the yield of wiring materials is reduced Moreover in view of the present or future tendency as mentioned above that the wiring pitch is reducing more and more, and further the multi-layer wiring structure is used essentially, it is probable that the above-mentioned problems become more important.

Hereinafter a conventional manufacturing technique of a semiconductor integrated circuit and problems of the technique will be described concretely with reference to the accompanying drawings.

FIG. 16 is a vertical sectional view that shows an example of a conventional wiring structure of a semiconductor integrated circuit. In FIG. 16, there is shown a four-layer type wiring structure, in which a first stratiform wiring 305 (a gate electrode 303) is comprised of a high melting metal polycide wiring, a second stratiform wiring 4 is comprised of a high melting metal wiring, a third stratiform wiring 7 and a fourth stratiform wiring 10 are respectively comprised of an aluminum wiring.

As shown in FIG. 16, in the conventional semiconductor integrated circuit, a semiconductor element 2 (transistor 2) is formed on a silicon substrate 1 (silicon semiconductor substrate). Hereupon the tungsten polycide layer (W polycide layer, $WSi_2$/poly-Si) which constructs the gate electrode 303 of the semiconductor element 2 is a part of the first stratiform wiring 305.

A lower insulating film 3 comprised of $SiO_2$ or BPSG (Boro-Phosphorous Silicate Glass) etc. is formed by deposition process on the semiconductor element 2 (transistor 2), and further on the lower insulating film 3, there is formed contact holes 306,307 which are used for performing electrical connection between impurity diffusion layers 304 formed on the silicon substrate 1 or the first stratiform wiring 305 and other wirings.

Further the second stratiform wiring 4 (tungsten wiring) comprised of tungsten is provided on the lower insulating film 3. The tungsten film 4 (W film) is generally formed by deposition process by means of the CVD method, and also has good ability of step-coverage, so that the contact holes 306,307 are filled with parts of the tungsten film 4, as apparent from FIG. 16.

Further a planed first interlayer insulating film 5 is formed on the second stratiform wiring 4 (tungsten wiring), and then there is formed in the first interlayer insulating film 5 a plurality of primary via-holes 313 for performing electrical connections between the second stratiform wiring 4 and other wirings. Moreover, as apparent from FIG. 16, the primary via-holes 313 are filled with parts of tungsten film, so that the parts of tungsten film form plug contacts 6.

Moreover the third stratiform wiring 7 (aluminum wiring) is formed on the film 5. Similarly, on the third stratiform wiring 7 (aluminum wiring), there are formed a second interlayer insulating film 8, a plurality of secondary via-holes 321 in which plug contacts 9 comprised of tungsten for connecting electrically the third stratiform wiring 7 to other wirings are formed, the fourth stratiform wiring 10 (aluminum wiring) comprised of aluminum, and a protection insulating film 11 which covers the fourth stratiform film 10.

Hereinafter a conventional manufacturing method of the wiring structure of the semiconductor integrated circuit will be described step by step with reference to FIGS. 17–28.

At first, as shown in FIG. 17, the semiconductor element 2 (transistor 2) is formed on the surface of a silicon substrate 1. The semiconductor element 2 (transistor 2) is comprised of an element separating oxide film 301, a gate oxide film 302, the gate electrode 303 having a tungsten polycide structure (W polycide structure) comprised of a polycrystalline silicon 303a and a tungsten silicide 303b ($WSiO_2$), and the impurity diffusion layers 304.

Further the tungsten polycide layer ($WSiO_2$/poly-Si) which constructs the gate electrode 303 is also formed on the element separating oxide film 301, and then the layer is used as the first stratiform wiring 305 (305a,305b). And on the semiconductor element 2 (transistor 2) and the first stratiform wiring 305, there are formed by deposition process the lower insulating film 3 comprised of silicon oxide film ($SiO_2$), BPSG (Boro-Phosphorous Silicate Glass) film which is a doped silicon oxide film containing boron (B) or phosphorous (P), and so on.

Next, as shown in FIG. 18, the contact holes 306,307 are formed at a predetermined parts of the lower insulating film 3 by means of a photoengraving technique and a dry etching technique, in order to form electrical contacts for connecting the impurity diffusion layers 304 formed on the silicon substrate 1 or the first stratiform wiring 305 to other wirings.

Then, as shown in FIG. 19, a barrier metal film 308 is formed by deposition procession the whole surface of the lower insulating film 3. The barrier metal 308 is generally formed by means of a sputter etching, and then the barrier metal 308 is required to have qualities as follows.

(a) The barrier metal 308 can contact stably to the silicon substrate 1 (impurity diffusion layer 304) with a low resistance.

(b) The barrier metal 308 can have a good adhesion with a tungsten film 309 formed by deposition process thereon as under-layer. Generally speaking, the adhesion between a tungsten film and a silicon oxide film is week.

(c) The barrier metal 308 can prevent the silicon substrate 1 (impurity diffusion layer) from suffering a damage caused by gas such as $WF_6$ used at the time of forming of the tungsten film 309 by means of the CVD method.

Hereat, as such a barrier metal film 308, there are used widely a laminated film comprised of titanium (Ti) and titanium nitride (TiN), titanium-tungsten film (TiW) and so on.

After forming of the barrier metal film 308, the semiconductor integrated circuit is subjected to a short thermal treatment of a few ten seconds to a few minutes at 600–800° C., in order to perform a stable contact with low resistance between the barrier metal 308 and the silicon substrate 1 (the impurity diffusion layer 304) or the first stratiform wiring 305. Then, for example, using gases such as $WF_6$, $H_2$ and so on, the tungsten film 309 is formed by deposition process on the whole surface of the barrier metal 308, under the condition of 400–500° C. depositing temperature by means of the CVD method.

In this case, since the tungsten film 309 is formed by means of the CVD method, the tungsten film 309 can possesses good step-coverage, so that the contact holes 306,307 are filled completely with parts of the tungsten film 309, as apparent from FIG. 19.

Next, as shown in FIG. 20, the barrier metal film 308 and tungsten film 309 formed by deposition process on the lower insulating film 3 are generally subjected to a patterning treatment using a photoengraving technique and a dry etching technique, so that the second stratiform wiring 4 (tungsten wiring) is formed.

Then, as shown in FIG. 21, the primary interlayer insulating film 5 is formed on the second stratiform wiring 4 (tungsten wiring). The primary interlayer insulating film 5 is, for example, such an insulating film that is comprised of a combination of a silicon oxide film 310 formed by deposition process by means of the CVD method, an inorganic coating insulating film 311 and a silicon oxide film 312 formed by deposition process by means of the CVD method.

The silicon oxide film 310 is generally formed by a deposition process by means of the CVD method using heat or plasma at 300–450° C. of depositing temperature under a surroundings of gas mixture containing silane gas ($SiH_4$) and oxygen gas ($O_2$) or nitrogen suboxide gas ($N_2O$). Moreover it may be used such a silicon oxide film that is formed by a deposition process using organic silane type materials such as TEOS (Tetra-Ethyl-Ortho-Silicate) etc. which have good step-coverage.

Hereat as the inorganic coating insulating film 311 formed for planarization, it is generally used such a film that contains silanol ($Si(OH)_4$) as a main component. A material which contains silanol as a main component is painted on the silicon oxide film 310 by rotary-painting process to be formed a layer, and then the layer is subjected to a baking treatment at 400–450° C., thus to be converted to a silicon oxide film, so that the surface of the silicon oxide film 310 formed by means of the CVD method is planed. And then the silicon oxide film 312 is formed on the inorganic coating insulating film 311 by deposition process as the same process as the process of forming the silicon oxide film 310.

Next, as shown in FIG. 22, at predetermined portions of the primary interlayer insulating film 5, there are formed the primary via-holes 313 by means of a photoengraving technique and a dry etching technique, in order to enable to form electrical contact between the second stratiform wiring 4 (tungsten wiring) and an upper wiring which will be formed thereafter.

Further, as shown in FIG. 23, after cleaning of a bottom of the primary via-holes 313 by means of a sputter etching treatment using argon ions ($Ar^+$), on a whole surface of the primary interlayer insulating film 5, there is formed by deposition process an under film 314 for the first tungsten plug contacts 6, in order to perform a stable connection with low resistance between the second stratiform wiring 4 (tungsten wiring) and an upper wiring.

The under film 314 for the first tungsten plug contacts 6 is generally formed by means of deposition of the sputter method, wherein tungsten plug contacts 6 are required to have such properties as follows.

(a) The plug contacts 6 can make stable contact with low resistance to the lower wiring (in this case, the second stratiform wiring 4).

(b) The under film 314 can have a good adhesion to the tungsten film 315 to be formed by deposition process thereon. An adhesion between a tungsten film and a silicon oxide film is generally poor.

Hereat, as the under film 314 as mentioned above, there are used widely a laminated film comprised of titanium (Ti) and titanium nitride (TiN), titanium-tungsten film (TiW) and so on. After this a tungsten film 315 is formed by deposition process by means of the CVD method on a whole surface of the under film 314 at the condition as well as in forming the second stratiform wiring 4 (tungsten wiring).

Next, as shown in FIG. 24, the tungsten film 315 is subjected to an etch-back treatment by means of a dry etching technique, for example, using gas such as $SF_6$, so that parts of the tungsten film 315 which is remained in the first via-holes 313 result in the tungsten plug contacts 6. At this time, as the etching condition has been predetermined such that the etching rate of the titanium nitride film is much lower than that of the tungsten film (about $\frac{1}{20}$–$\frac{1}{50}$), the under film 314 acts as a stopper against the tungsten etch-back treatment.

After this, as shown in FIG. 25, an aluminum alloy film 316 is formed on the whole surface of the semiconductor integrated circuit on a way of manufacturing process by deposition process by means of the sputter method, and then an antireflection film 317 is formed on the aluminum alloy film 316 by the same process. Hereat the aluminum alloy film 316 is generally comprised of an aluminum alloy containing impurity elements such as Cu, for example Al—Si—Cu or Al—Cu, in order to elevate the reliability of the aluminum alloy wiring. On the other hand the antireflection film 317 is generally comprised of titanium nitride which has low reflectance in a wavelength region such as i-line or g-line for photoengraving, in order to elevate photoengraving margin of the third stratiform wiring 7 (the aluminum wiring).

And then, as shown in FIG. 26, the under film 314 of the tungsten plug contacts 6, the aluminum alloy film 316 and the antireflection film 317 are subjected to a patterning treatment by means of a photoengraving technique and a dry etching technique, so that the third stratiform wiring 7 (aluminum wiring) is formed.

Hereinafter, in the same manner, there is formed the secondary interlayer insulating film 8 comprised of a silicon oxide film 318 formed by deposition process by means of the CVD method, an inorganic coating insulating film 319 and a silicon oxide film 320 formed by deposition process by means of the CVD method.

Next the secondary via-holes 321 are formed at a predetermined parts of the secondary interlayer insulating film 8 by means of a photoengraving technique and a dry etching technique, in order to form electrical contacts for connecting the third stratiform wiring 7 (the aluminum wiring) to another wiring.

Then, as shown in FIG. 27, there is formed by deposition process a laminated film 322 comprised of titanium (Ti) and titanium nitride (TiN), which is an under film of the secondary tungsten plug contacts 9, and then a tungsten film is formed by deposition process thereon, so that the tungsten film is subjected to etch-back treatment all over the surface thereof to be formed the secondary tungsten plug contacts 9. Moreover, on the surface of the laminated film 322, there is formed by deposition process an aluminum alloy film 323 comprised of Al—Si—Cu or Al—Cu, further there is formed thereon by deposition process a titanium nitride film 324 which acts as a antireflection film, then the fourth aluminum wiring 10 is formed by means of patterning treatment using a photoengraving technique or a dry etching technique, so that the wiring structure as shown in FIG. 27 is obtained.

Finally, as shown in FIG. 28, on the fourth aluminum wiring 10, there is formed the protective insulating film 11 comprised of a silicon nitride film, silicon oxide film, silicon oxide nitride film, or a combination of those.

However according to the above-mentioned conventional method for manufacturing the wiring structure of the semiconductor integrated circuit, there is such a problem that if debris or residues are created during the process time, and the debris or residues remain in the wiring structure, they result in a wiring defect.

For example, in the manufacturing process for forming the second stratiform wiring 4 (tungsten wiring) of the four-layer type wiring structure as shown in FIG. 16, let us suppose that a debris 401 adheres on the barrier metal 308, and then the tungsten film 309 is formed over the debris at the step of forming the film 309, as shown in FIG. 29.

Then, as shown in FIG. 30, a photo resist pattern 402 is formed by means of a photoengraving technique, and then when the photo resist pattern is subjected to a patterning treatment by means of a dry etching technique, around the debris 401, there remains a residue 404 of tungsten or a residue 405 of the barrier metal film 308 under the second stratiform wiring 4. On the other hand, polymer 403 containing tungsten adheres on the side wall of the second stratiform wiring 4 (tungsten wiring) or the photo resist 402 during the dry etching process.

And then, as shown FIG. 31, on the wiring, there remains a polymer 406 which has not been removed completely during the photo resist removal process, or around the debris 401 among the wiring, there remain residues 404,405 of tungsten or barrier metal. Thus there is such a problem that the polymer or the residue often causes a short circuit among the wirings, or results in a wiring defect to be formed thereon.

Further, as another example, in the manufacturing process for forming the plug contacts 6 of the four-layer type wiring structure as shown in FIG. 16, let us suppose that a debris 407 adheres on the under film 314, and then the tungsten film 315 is formed by deposition process on the debris, as shown in FIG. 32.

In this case, as shown in FIG. 33, when the whole surface of the tungsten film 315 (see FIG. 32) is subjected to an etch-back treatment, a tungsten film 408 remains around the debris 407. Further according to circumstances a mere etch-back residue 409 of tungsten caused by etch-back process may remain. Then, after the aluminum alloy film 315 and the antireflection film 316 are formed by deposition process on the debris 407 or the residues 408,409, the third stratiform wiring 7 (aluminum wiring) is formed by means of a photoengraving technique or a dry etching technique, and then there is such a problem that a short circuit occurs near the debris 407 or the etch-back residue 409 at that time.

Thus many kinds of methods for removing debris or residues as mentioned above have been examined. For example, in the report titled "Multiobjective Washing Method by means of $H_2SO_4/H_2O_2/HF$ Solution" written by Ohnishi et. al. inserted in the monthly magazine "Semiconductor World" pp. 26–28, published November 1993, there has been disclosed a washing method for washing a silicon substrate using chemicals containing strong acid or strong base. However according to such a conventional washing method that has high ability of washing, there is such a problem that wirings themselves are etched very strongly by the chemicals containing strong acid or strong base, thus to be suffered a damage. Therefore the conventional washing method is not appropriate as a method for washing the above-mentioned wiring structure during a wiring forming process.

Therefore, as a washing method for washing such a wiring structure during a wiring forming process, a physical washing method in which any chemicals are not used and only pure water is used has been generally used. One of such conventional washing methods has been disclosed in the report titled "The Equipment Washing Apparatus" written by Hirai, inserted in the monthly magazine "Semiconductor World" pp. 138–142, published August 1993.

As disclosed in the report, as physical washing methods using pure water, such methods as follows have been conventionally known.

(a) Brush washing: This is such a washing method that a brush of cylindrical type or disk type is pushed against a surface of a wafer, and then the brush and the wafer are both rotated, so that the wafer is washed.

(b) High-pressure jet washing: This is such a washing method that water containing only mere $CO_2$ for preventing occurrence of static electricity is blown against a wafer with high pressure, so that the wafer is washed.

(c) Ultrasonic wave washing: This is such a washing method that ultrasonic wave having frequency of about 1 MHz is added to a nozzle for pure water, so that vibration is added to pure water, and then the pure water is blown to a wafer.

(d) Pure water rinsing: This is such a method that a wafer is washed by means of only pure water blowing thereto.

Hereat each of these washing processes is generally performed by means of an apparatus called "spin-scrubber", in which the wafer is subjected to a spinning treatment one by one.

However in each of the above-mentioned conventional physical washing methods, washing ability is poor in comparison with the conventional chemical washing method using chemicals. Consequently, according to each of the conventional physical washing methods, though debris or residues located merely on a surface of the semiconductor integrated circuit can be removed, sufficient washing effect cannot be achieved for debris buried partially in a film or debris or residues adhered strongly to the film. The reason is such that though it is necessary for achieving a high washing effect to etch the under film slightly, it is theoretically impossible for a physical washing using pure water to etch so.

As mentioned above, for example, in the method for manufacturing the wiring structure of the semiconductor integrated circuit as shown in FIG. 16, it is necessary to get a new washing method that can wash away (remove) debris or residues without causing an extreme etch or a damage on the wiring structure, in order to prevent wiring defects caused by the debris or the residues formed during the wiring structure forming process.

However according to a washing method using acid solution or alkali solution, since the wiring patterns or the plug contacts comprised of high melting metal such as tungsten etc. are generally connected electrically to an impurity diffusion layer, there occurs a galvanic action caused by contact electric potential of PN junction of the part or a galvanic action caused by contact electric potential difference between different metals for example between a tungsten layer and a barrier metal layer, so that an extreme etch or a damage of the wiring structure is unavoidable.

SUMMARY OF THE INVENTION

The present invention has been developed to solve the above-mentioned conventional problems, and has an object of providing means which can remove debris or residues effectively without causing an extreme etching or a damage in a wiring structure during a process of forming a wiring structure of a semiconductor integrated circuit.

In order to achieve the above-mentioned object, according to the present invention, in a washing treatment for a wiring structure comprised of high melting metal, high melting metal silicide, high melting metal compound and/or so on, neutral solution of pH 6 to pH 8 containing oxidant, for example aqueous solution of the oxidant etc. is used as washing liquid. Preferably neutral solution containing peroxide such as hydrogen peroxide or ozone as oxidant is used. Since such neutral solution is neutral, it has such a characteristic that it does not suffer remarkable influence of the above-mentioned galvanic actions.

Moreover it is believed conventionally that such neutral solution containing oxidant scarcely etch high melting metal etc. within a comparatively low or normal temperature region of about 20 to 40° C. However, according to the result obtained through the present inventors' detail experiment, it is identified that etching rate of a large wiring pattern having a width or diameter larger than a several millimeters in plane view is surely small, but etching rate of residue caused by a very small debris having a width or diameter of half-micron order in plane view is considerably large (more than a hundred times of the etching rate of the large wiring pattern).

After all etching rate remarkably depends on a size of a material to be etched, so that a wiring pattern with a relatively large surface area is scarcely etched (less damage), on the other hand etching rate of a debris or residue with a very small surface area is large.

For example, in FIG. 1, there is shown an example of area-dependency of etching rate of a tungsten film against hydrogen peroxide aqueous solution of normal temperature.

Therefore, by utilizing such etching characteristic preferably, it becomes possible that only a very small debris or a residue is selectively removed, on the other hand a wiring pattern or a plug contact comprised of high melting metal such as tungsten scarcely suffers a damage.

Further, the present inventors have found out such fact that when the above-mentioned chemical washing process using neutral solution containing oxidant is combined with a physical washing process using brushes, high pressure jet, ultrasonic wave, fine water particles or fine ice particles, washing (removal) operation against the debris or the residue is further elevated by an interaction or an additive action of the both.

Then more concretely, according to a first aspect of the present invention, there is provided a method of manufacturing a semiconductor integrated circuit in which semiconductor elements and a wiring structure connecting the semiconductor elements one another are located on a semiconductor substrate, the method comprising the steps of, forming sequentially a series of wiring elements, each of which constructs the wiring structure, and washing the semiconductor integrated circuit under manufacturing process, by means of neutral solution containing oxidant, during a term of forming of the wiring elements.

According to a second aspect of the present invention, there is provided a method, wherein, in the first aspect of the present invention, peroxide is used as the oxidant.

According to a third aspect of the present invention, there is provided a method wherein, in the second aspect of the present invention, hydrogen peroxide is used as the peroxide.

According to a fourth aspect of the present invention, there is a provided a method, wherein, in the second aspect of the present invention, ozone is used as the peroxide.

According to a fifth aspect of the present invention, there is provided a method, wherein, in any one of the first to fourth aspects of the present invention, the temperature of the neutral solution is maintained within a range of 20 to 40° C.

According to a sixth aspect of the present invention, there is provided a method, wherein, in any one of the first to fifth aspects of the present invention, the method further comprises the step of filling contact holes adjacent to the semiconductor substrate or a predetermined wiring element, with parts of a conductive film, thus to form plug contacts, each of which falls under one of the wiring elements, wherein the washing step is performed next to the plug contacts forming step.

According to a seventh aspect of the present invention, there is provided a method, wherein, in any one of the first to fifth aspects of the present invention, the method further comprises the step of forming wiring patterns, each of which falls under one of the wiring elements, wherein the washing step is performed next to the wiring patterns forming step.

According to a eighth aspect of the present invention, there is provided a method, wherein, in the sixth or seventh aspect of the present invention, the plug contacts or the wiring patterns are made of metal with high melting point or metal compound with high melting point.

According to a ninth aspect of the present invention, there is provided a method, wherein, in any one of the first to eighth aspects of the present invention, a physical washing process which has additive cleaning effect against a chemical washing process using the neutral solution, is performed together with the chemical washing process.

According to a tenth aspect of the present invention, there is provided a method, wherein, in the ninth aspect of the present invention, the physical washing process comprises at least one of washing treatment with brushes, washing treatment with ultrasonic wave and washing treatment with fine particles of ice or water.

According to a eleventh aspect of the present invention, there is provided an apparatus for manufacturing a semiconductor integrated circuit comprising rotatable holding means for holding and rotating the semiconductor integrated circuit, and neutral solution feeding means for feeding neutral solution containing oxidant onto the semiconductor integrated circuit.

According to a twelfth aspect of the present invention, there is provided an apparatus for manufacturing a semiconductor integrated circuit comprising rotatable holding means for holding and rotating the semiconductor integrated circuit, neutral solution feeding means for feeding neutral solution containing oxidant onto the semiconductor integrated circuit, and brush rotating means for pushing brushes onto the semiconductor integrated circuit and rotating the brushes.

According to a thirteenth aspect of the present invention, there is provided an apparatus for manufacturing a semiconductor integrated circuit comprising rotatable holding means for holding and rotating the semiconductor integrated circuit, and neutral solution feeding means for pressurizing neutral solution containing oxidant, thus to feed the pressurized neutral solution onto the semiconductor integrated circuit.

According to a fourteenth aspect of the present invention, there is provided an apparatus for manufacturing a semiconductor integrated circuit comprising rotatable holding means for holding and rotating the semiconductor integrated circuit, neutral solution feeding means for feeding neutral solution containing oxidant onto the semiconductor integrated circuit, and ultrasonic wave adding means for adding ultrasonic wave into the neutral solution.

According to a fifteenth aspect of the present invention, there is provided an apparatus for manufacturing a semiconductor integrated circuit comprising rotatable holding means for holding and rotating the semiconductor integrated circuit, neutral solution feeding means for feeding neutral solution containing oxidant onto the semiconductor integrated circuit, and fine particles blowing means for blowing at least one of fine water particles and fine ice particles onto the semiconductor integrated circuit.

According to a sixteenth aspect of the present invention, there is provided an apparatus, wherein, in any one of the eleventh to fifteenth aspects of the present invention, the apparatus further comprises scanning means for scanning the neutral solution means along a surface of the semiconductor integrated circuit.

According to a seventeenth aspect of the present invention, it is provided an apparatus, wherein, in any one of the eleventh to sixteenth aspects of the present invention, the apparatus further comprises pure water feeding means for feeding pure water onto the semiconductor integrated circuit.

According to a eighteenth aspect of the present invention, there is provided an apparatus, wherein, in any one of the eleventh to seventeenth aspects of the present invention, the oxidant comprises peroxide.

According to a nineteenth aspect of the present invention, there is provided an apparatus, wherein, in the eighteenth aspect of the present invention, the peroxide comprises hydrogen peroxide.

According to a twentieth aspect of the present invention, there is provided an apparatus, wherein, in the eighteenth aspect of the present invention, the peroxide comprises ozone.

According to a twenty-first aspect of the present invention, there is provided an apparatus, wherein, in any one of the eleventh to twentieth aspect of the present invention, the apparatus further comprises temperature control means for maintaining the temperature of the neutral solution within a range of 20 to 40° C.

According to the present invention, there are achieved such remarkable operations and effects as follows.

Namely, if debris or residues are formed during a process of forming of wiring patterns or plug contacts comprised of high melting metal, high melting metal silicide and/or high melting metal compound, the debris or the residues are washed away (removed) selectively and effectively, without causing an extreme etching or a damage in the wiring patterns or the plug contacts. Therefore occurrence of wiring defects is reduced, the quality level of the wiring structure and consequently the quality level of the semiconductor integrated circuit is elevated, and the yield of wiring materials is elevated, so that the productivity of the semiconductor integrated circuit is elevated.

Concretely, according to the first aspect of the present invention, the semiconductor integrated circuit under manufacturing process is washed by means of the neutral solution containing oxidant during a series of wiring elements forming operations in which each of the wiring elements is formed sequentially. Then in the washing, it occurs such a phenomenon that etching rate of the wiring elements which have relatively large exposure area against the neutral solution becomes smaller, on the other hand etching rate of debris or residues which have relatively small exposure area against the neutral solution becomes larger (Hereinafter the above-mentioned phenomenon will be referred to "exposure area depending phenomenon"). Consequently in the washing process during the wiring elements forming operation, the wiring elements such as wiring patterns, plug contacts and so on are scarcely etched, on the other hand the debris or the residues are etched strongly thus to be removed.

Therefore occurrence of wiring defects in the semiconductor integrated circuit is reduced, so that the quality level of the semiconductor integrated circuit is elevated. Moreover the yield of semiconductor materials is elevated, so that the productivity of the semiconductor integrated circuit is elevated.

According to the second aspect of the present invention, fundamentally the same operations and effects as in the first aspect of the present invention are achieved. Moreover oxide comprises peroxide, then peroxide causes particularly remarkable exposure area depending phenomenon, so that the removal operation of debris or residues is elevated, preventing occurrence of an extreme etching or a damage of the wiring element. Therefore the quality level and the productivity of the semiconductor integrated circuit are elevated much more.

According to the third aspect of the present invention, fundamentally, the same operations and effects as in the second aspect of the present invention are achieved. Further the peroxide comprises hydrogen peroxide, and then hydrogen peroxide causes more remarkable exposure area depending phenomenon, consequently removal operation of debris or residues is accelerated much more without causing an extreme etching or a damage of the wiring element. Therefore the quality level and the productivity of the semiconductor integrated circuit are elevated much more.

According to the fourth aspect of the present invention, fundamentally, the same operations and effects as in the second aspect of the present invention are achieved. Further the peroxide comprises ozone, and then ozone causes more remarkable exposure area depending phenomenon, consequently removal operation of debris or residues is accelerated much more without causing an extreme etching or a damage of the wiring element. Therefore the quality level and the productivity of the semiconductor integrated circuit are elevated much more.

According to the fifth aspect of the present invention, fundamentally, the same operations and effects as in any one of the first to fourth aspects of the present invention are achieved. Further the temperature of the neutral solution is maintained within a range of 20 to 40° C., and then generally etching operation of the neutral solution is elevated when the temperature is high, therefore by maintaining the temperature within the range an extreme etching of the wiring pattern is certainly prevented. Therefore the productivity of the semiconductor integrated circuit is elevated much more.

According to the sixth aspect of the present invention, fundamentally, the same operations and effects as in any one of the first to fifth aspects of the present invention are achieved. Further since the washing process is performed next to the plug contact forming process, debris or residues adhered on the semiconductor integrated circuit under manufacturing process during the plug contacts forming process are removed. Therefore the quality level and the productivity of the semiconductor integrated circuit are elevated much more.

According to the seventh aspect of the present invention, fundamentally, the same operations and effects as in the first to fifth aspects of the invention are achieved. Further since the washing process is performed next to the wiring patterns forming process, debris or residues adhered on the semiconductor integrated circuit under manufacturing process during the wiring patterns forming process are removed. Therefore the quality level and the productivity of the semiconductor integrated circuit are elevated much more.

According to the eighth aspect of the present invention, fundamentally, the same operations and effects as in the sixth or seventh aspect of the present invention are achieved. Further the plug contacts or the wiring patterns are comprised of high melting metal, high melting metal silicide or high melting metal compound, and then each of the high melting materials causes particularly remarkable exposure area depending phenomenon, consequently removal operation of debris or wiring patterns is accelerated much more without causing an extreme etching or a damage of the plug contact or the wiring pattern. Therefore the quality level and the productivity of the semiconductor integrated circuit are elevated much more.

According to the ninth aspect of the present invention, fundamentally, the same operations and effects as in any one of the first to eighth aspects of the present invention are achieved. Further since the physical washing process having an additive cleaning effect against the chemical washing process using the neutral solution is performed together, removal operation of debris or residues is elevated much more. Therefore the quality level and the productivity of the semiconductor integrated circuit are elevated much more.

According to the tenth aspect of the present invention, fundamentally, the same operations and effects as in the ninth aspect of the present invention are achieved. Further since at least one of a washing treatment with brushes, a washing treatment with ultrasonic wave and a washing treatment with fine particles of ice or water, each of which has strong physical cleaning action, is used together with the washing using the neutral solution, removal operation of the debris or the residues is elevated much more. Therefore the quality level and the productivity of the semiconductor integrated circuit are elevated much more.

According to the eleventh aspect of the present invention, the neutral solution containing oxidant is fed onto the semiconductor rotated by the rotatable holding means, so that the semiconductor integrated circuit is washed by the neutral solution. In the washing it occurs such exposure area depending phenomenon that etching rate of the wiring structure having relatively large exposure area against the neutral solution becomes smaller, on the other hand etching rate of debris or residues having relatively small exposure area against the neutral solution becomes larger, therefore the wiring elements such as plug contacts or wiring patterns scarcely etched, but the debris or the residues are etched thus to be removed. Therefore, as occurrence of wiring defects of the semiconductor integrated circuit is reduced, the quality level of the semiconductor integrated circuit is elevated, and the yield of semiconductor materials is elevated, so that the productivity of the semiconductor integrated circuit is elevated.

According to the twelfth aspect of the present invention, the neutral solution containing oxidant is fed onto the semiconductor rotated by the rotatable holding means, and then the semiconductor integrated circuit is washed by the neutral solution and also washed physically by the brushes. In the washing it occurs an exposure area depending phenomenon, therefore the wiring elements such as plug contacts or wiring patterns scarcely etched, but the debris or the residues are etched thus to be removed. Further removal operation of the debris or the residues is accelerated by the physical washing using the brushes. Therefore, as occurrence of wiring defects of the semiconductor integrated circuit is reduced, the quality level of the semiconductor integrated circuit is elevated, and the yield of semiconductor materials is elevated, so that the productivity of the semiconductor integrated circuit is elevated.

According to the thirteenth aspect of the present invention, the neutral solution containing oxidant is blown with high pressure onto the semiconductor rotated by the rotatable holding means, and then the semiconductor integrated circuit is washed by the neutral solution. In the washing it occurs an exposure area depending phenomenon, therefore the wiring elements such as plug contacts or wiring patterns scarcely etched, but the debris or the residues are etched thus to be removed. Therefore, as occurrence of wiring defects of the semiconductor integrated circuit is reduced, the quality level of the semiconductor integrated circuit is elevated, and the yield of semiconductor materials is elevated, so that the productivity of the semiconductor integrated circuit is elevated.

According to the fourteenth aspect of the present invention, the neutral solution containing oxidant is blown in condition of being added ultrasonic wave onto the semiconductor rotated by the rotatable holding means, and then the semiconductor integrated circuit is washed by the neutral solution. In the washing it occurs an exposure area depending phenomenon, therefore the wiring elements such as plug contacts or wiring patterns scarcely etched, but the debris or the residues are etched thus to be removed. Further, as ultrasonic wave add vibration to the neutral solution, removal operation of the debris or the residues is elevated. Therefore, as occurrence of wiring defects of the semiconductor integrated circuit is reduced, the quality level of the semiconductor integrated circuit is elevated, and the yield of semiconductor materials is elevated, so that the productivity of the semiconductor integrated circuit is elevated.

According to the fifteenth aspect of the present invention, the neutral solution containing oxidant is fed onto the semiconductor rotated by the rotatable holding means, and then the semiconductor integrated circuit is washed by the neutral solution and also washed physically by blowing the fine water particles or the fine ice particles thereto. In the washing it occurs an exposure area depending phenomenon, therefore the wiring elements such as plug contacts or wiring patterns scarcely etched, but the debris or the residues are etched thus to be removed. Further, removal operation of the debris or the residues is elevated by the physical washing with blowing the fine water particles or the fine ice particles. Therefore, as occurrence of wiring defects of the semiconductor integrated circuit is reduced, the quality level of the semiconductor integrated circuit is elevated, and the yield of semiconductor materials is elevated, so that the productivity of the semiconductor integrated circuit is elevated.

According to the sixteenth aspect of the present invention, fundamentally, the same operations and effects as in any one of the eleventh to fifteenth aspects of the present invention are achieved. Further, as the neutral solution feeding means is scanned along the surface of the semiconductor integrated circuit, the neutral solution is fed uniformly all over the surface of the semiconductor integrated circuit, so that the washing ability is elevated. Therefore the quality level and the productivity of the semiconductor integrated circuit are elevated much more.

According to the seventeenth aspect of the present invention, fundamentally, the same operations and effects as in any one of the eleventh to sixteenth aspects of the present invention are achieved. Further, as pure water is fed onto the semiconductor integrated circuit, the neutral solution is rinsed by pure water, and debris or residues settling merely on the surface of the semiconductor integrated circuit are rinsed away. Therefore quality level and productivity of the semiconductor integrated circuit is elevated much more.

According to the eighteenth aspect of the present invention, fundamentally, the same operations and effects as in any one of the eleventh to seventeenth aspects of the present invention are achieved. Moreover oxide comprises peroxide, then peroxide causes particularly remarkable exposure area depending phenomenon, so that the removal operation of the debris or residues is elevated, preventing occurrence of an extreme etching or a damage of the wiring element. Therefore the quality level and the productivity of the semiconductor integrated circuit are elevated much more.

According to the nineteenth aspect of the present invention, fundamentally, the same operations and effects as in the eighteenth aspect of the present invention are achieved. Further the peroxide comprises hydrogen peroxide, and then hydrogen peroxide causes more remarkable exposure area depending phenomenon, consequently removal operation of debris or residues is accelerated much more without causing an extreme etching or a damage of the wiring element. Therefore the quality level and productivity of the semiconductor integrated circuit are elevated much more.

According to the twentieth aspect of the present invention, fundamentally, the same operations and effects as in the eighteenth aspect of the present invention are achieved. Further the peroxide comprises ozone, and then ozone causes more remarkable exposure area depending phenomenon, consequently removal operation of debris or residues is accelerated much more without causing an extreme etching or a damage of the wiring element. Therefore the quality level and the productivity of the semiconductor integrated circuit are elevated much more.

According to the twenty-first aspect of the present invention, fundamentally, the same operations and effects as in any one of the eleventh to twentieth aspects of the present invention are achieved. Further the temperature of the neutral solution is maintained within a range of 20 to 40° C., and then generally etching operation of the neutral solution is elevated when the temperature is high, therefore by maintaining the temperature within the range an extreme etching of the wiring patterns is certainly prevented. Therefore the yield of the semiconductor materials are elevated, and then the productivity of the semiconductor integrated circuit is elevated much more.

BRIEF DESCRIPTION OF THE DRAWINGS

These and other objects, features and advantages of the present invention will become clear from the following description taken in conjunction with the preferred embodiments with reference to the accompanying drawings throughout which like parts are designated by like reference numerals, and in which.

DETAILED DESCRIPTION OF THE PREFERRED EMBODIMENTS

Hereinafter, there will be concretely described with reference to the accompanying drawings some preferred embodiments of the present invention, each of which is concerned with a washing method or a washing apparatus for washing a semiconductor integrated circuit including wiring patterns or plug contacts comprised of high melting metal, high melting metal silicide or high melting metal compound, utilizing a washing (removal) method using the above-mentioned neutral solution containing oxidant according to the present invention, or a washing method combined with a physical washing using brushes and so on. However the following examples are not intended to limit other methods or apparatuses according to the present invention.

At first there will be described some embodiments in which the present invention is applied to a wiring patterns forming process.

<Embodiment 1>

Figure 2:
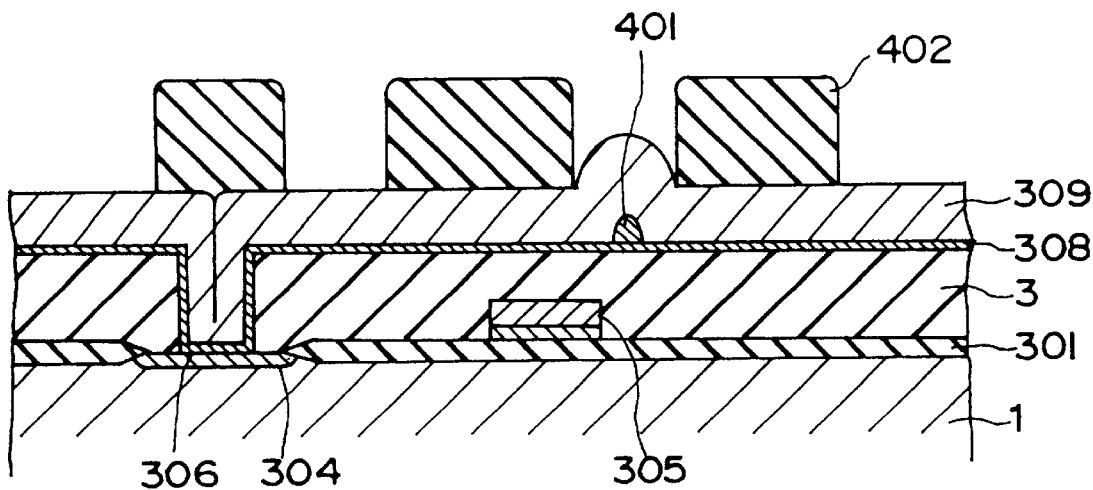
FIG. 2 is an explanatory vertical sectional view of a semiconductor integrated circuit, after a photoresist pattern is formed in the step of forming a second stratiform wiring of the semiconductor integrated circuit.
Figure 16:
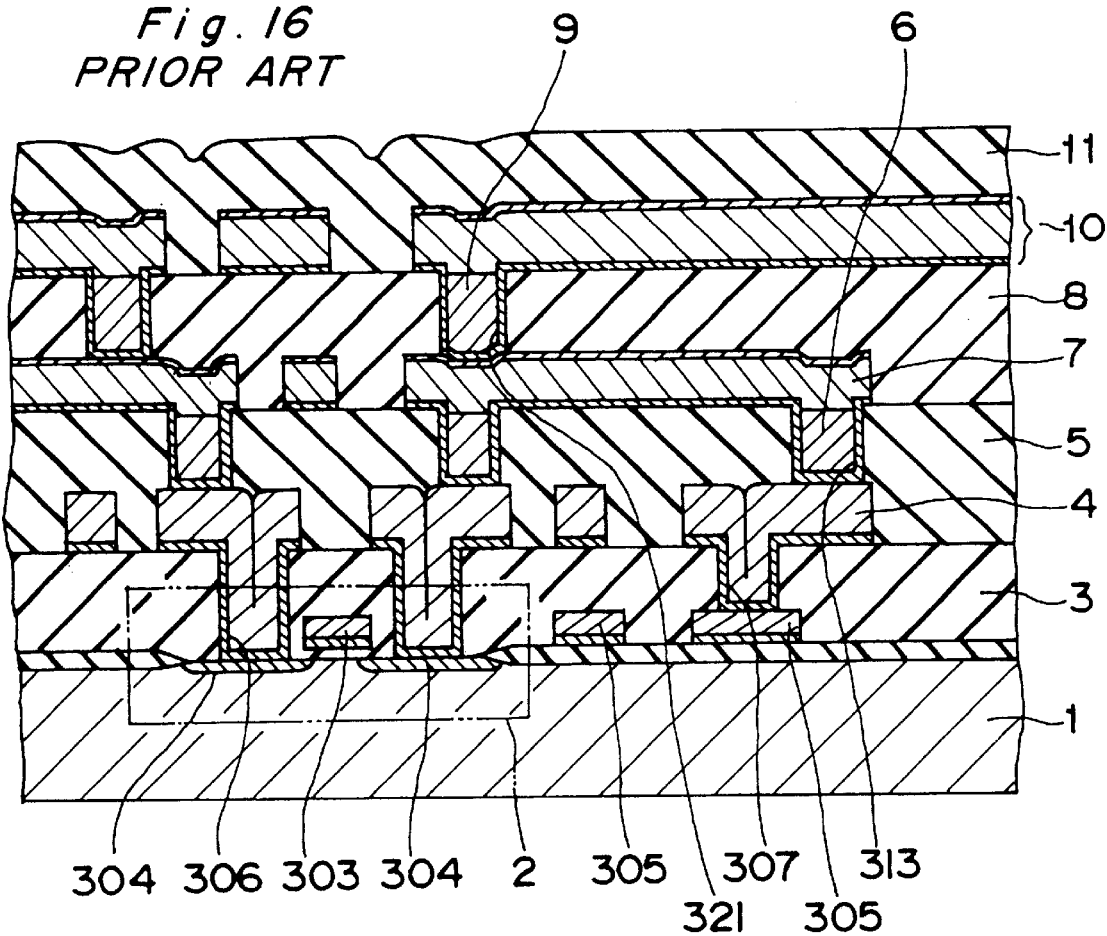
FIG. 16 is an explanatory vertical sectional view of a conventional semiconductor integrated having a four-layer type wiring structure.
Figure 17:
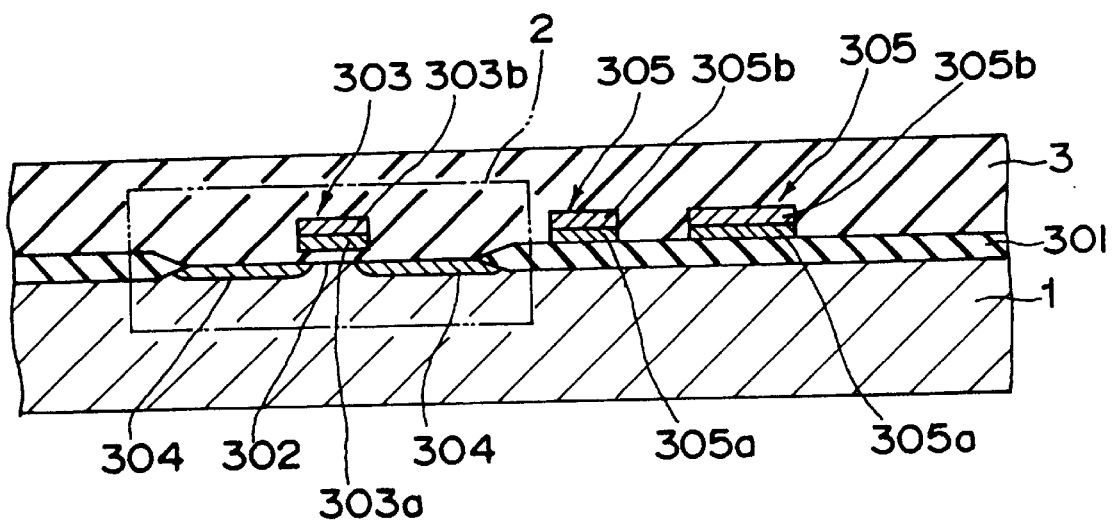
FIG. 17 is an explanatory vertical sectional view of a conventional semiconductor integrated circuit, after a lower insulating film is formed in the step of forming a second stratiform wiring of the semiconductor integrated circuit.
Figure 18:
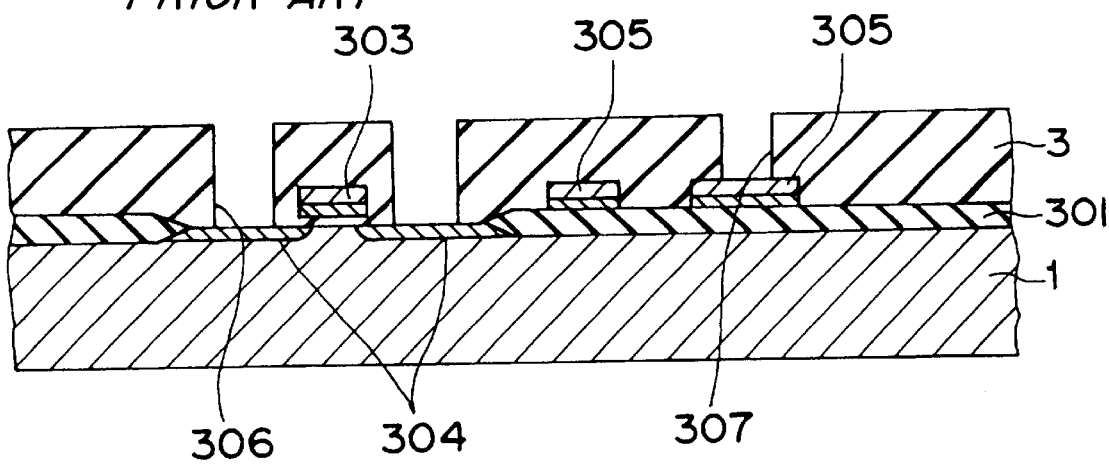
FIG. 18 is an explanatory vertical sectional view of a conventional semiconductor integrated circuit, after contact holes are formed in the step of forming a second stratiform wiring of the semiconductor integrated circuit.
Figure 19:
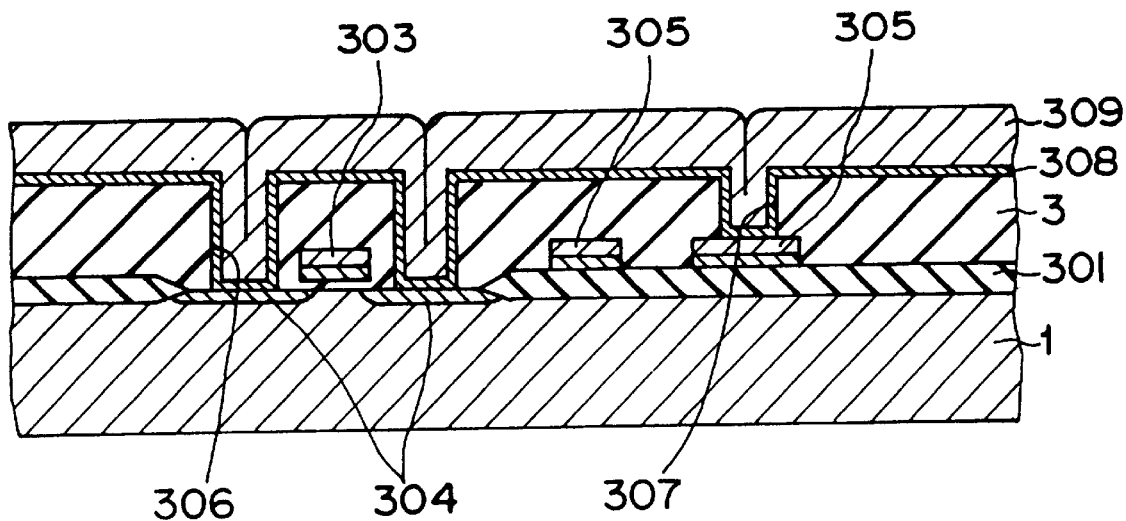
FIG. 19 is an explanatory vertical sectional view of a conventional semiconductor integrated circuit, after a tungsten film is formed in the step of forming a second stratiform wiring of the semiconductor integrated circuit.
Figure 20:
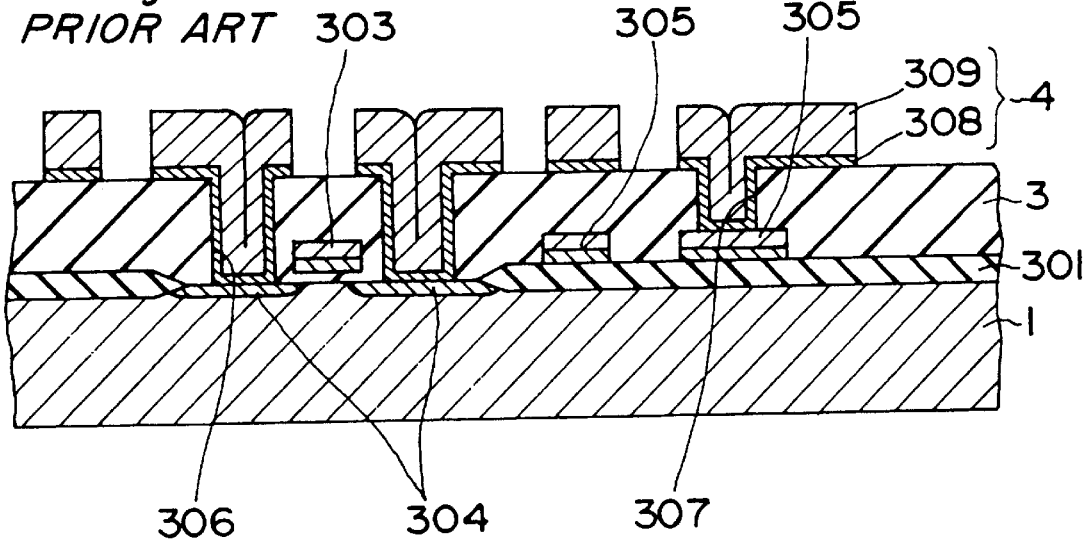
FIG. 20 is an explanatory vertical sectional view of a conventional semiconductor integrated circuit, after the step of forming a second stratiform wiring of the semiconductor integrated circuit is finished.
Figure 21:
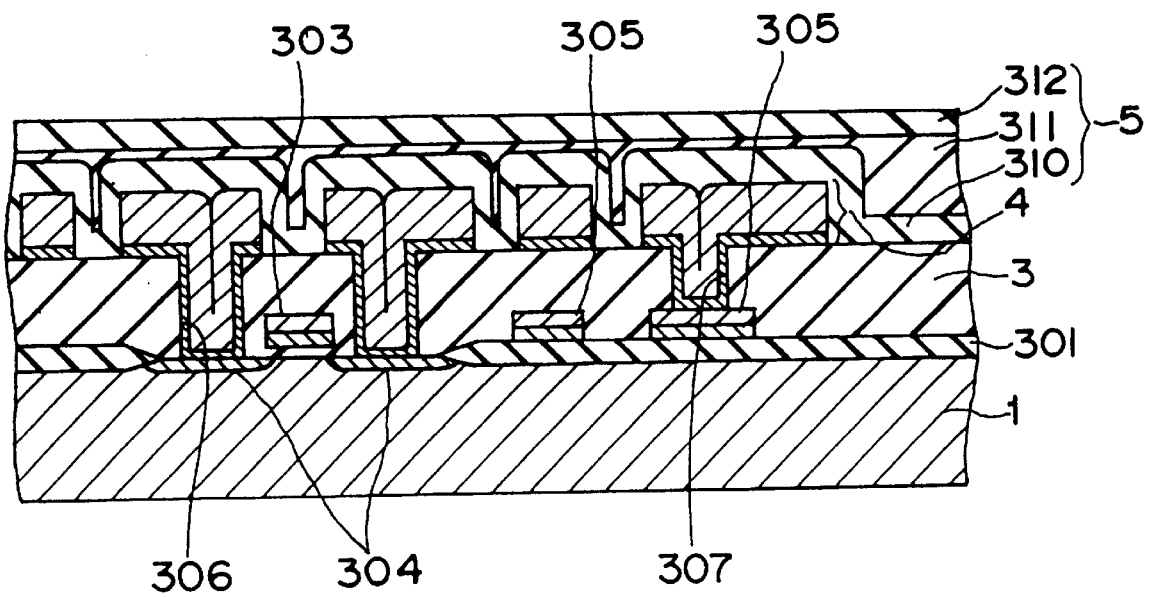
FIG. 21 is an explanatory vertical sectional view of a conventional semiconductor integrated circuit, after a primary interlayer insulating film is formed in the step of forming plug constants of the semiconductor integrated circuit.
Figure 22:
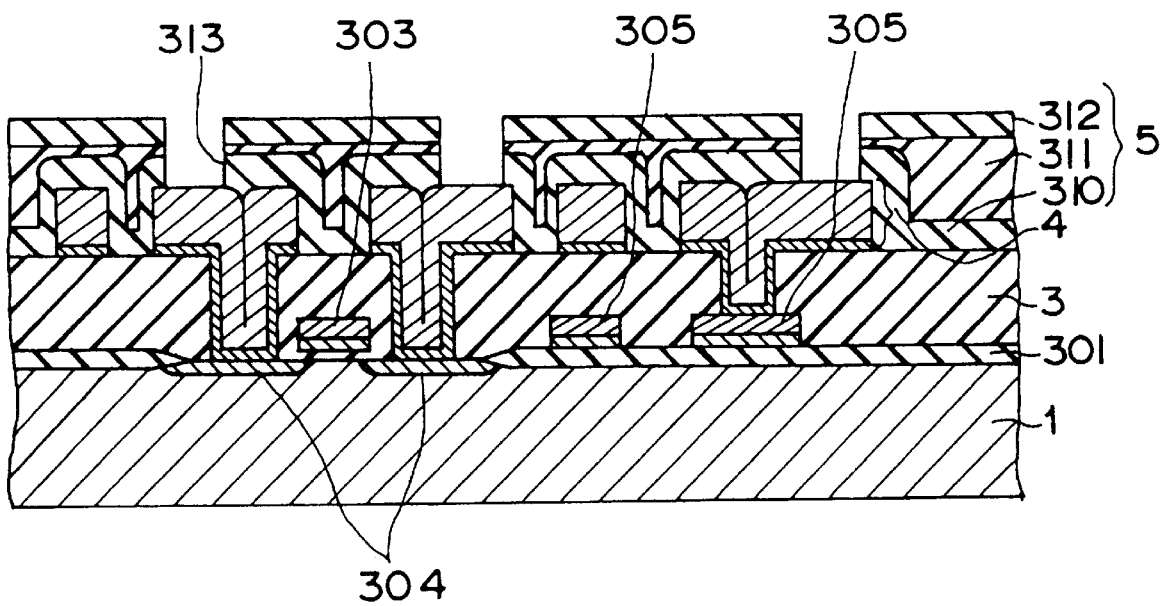
FIG. 22 is an explanatory vertical sectional view of a conventional semiconductor integrated circuit, after first via-holes are formed in the step of forming plug constants of the semiconductor integrated circuit.
Figure 23:
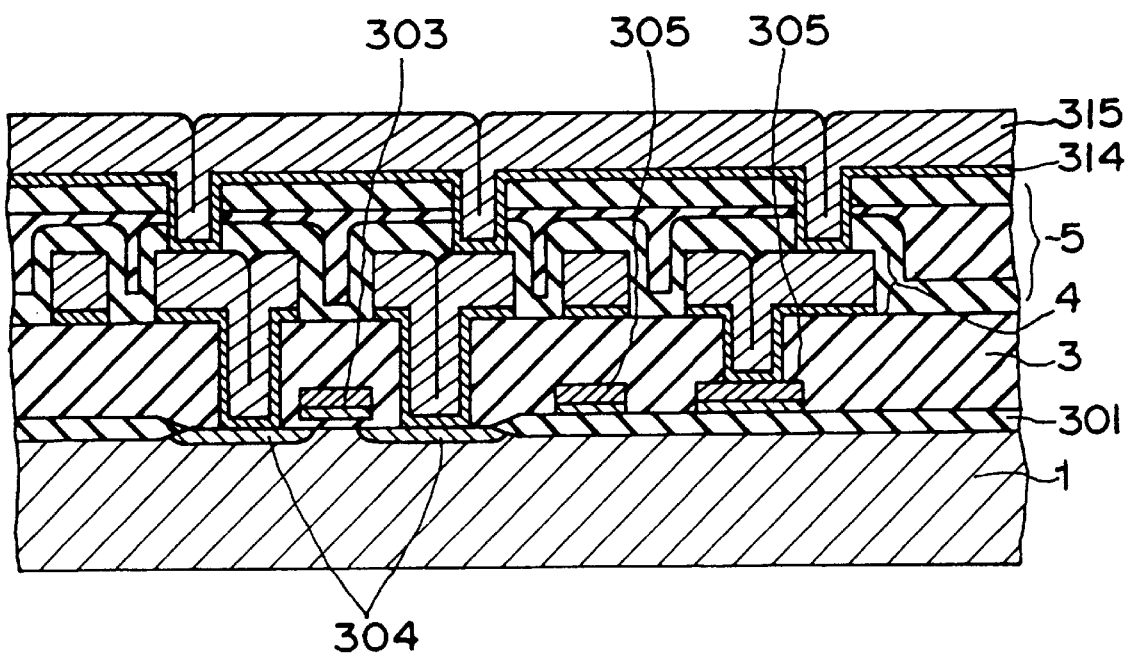
FIG. 23 is an explanatory vertical sectional view of a conventional semiconductor integrated circuit, after a tungsten film is formed by deposition in the step of forming plug constants of the semiconductor integrated circuit.
Figure 24:
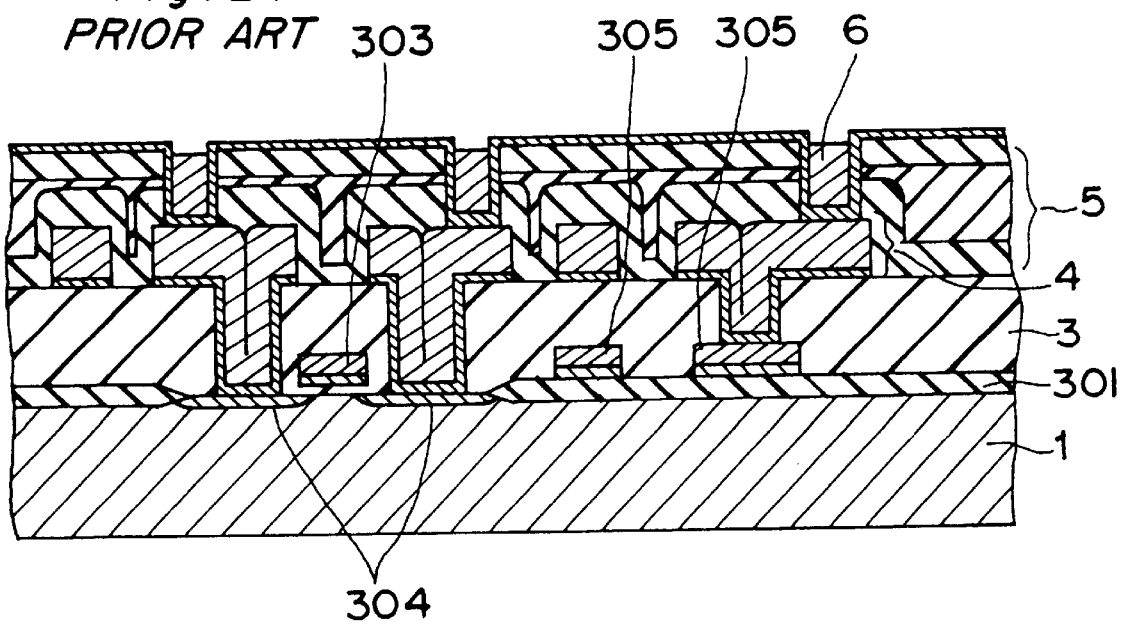
FIG. 24 is an explanatory vertical sectional view of a conventional semiconductor integrated circuit, after a tungsten film is etched back in the step of forming plug constants of the semiconductor integrated circuit.
Figure 25:
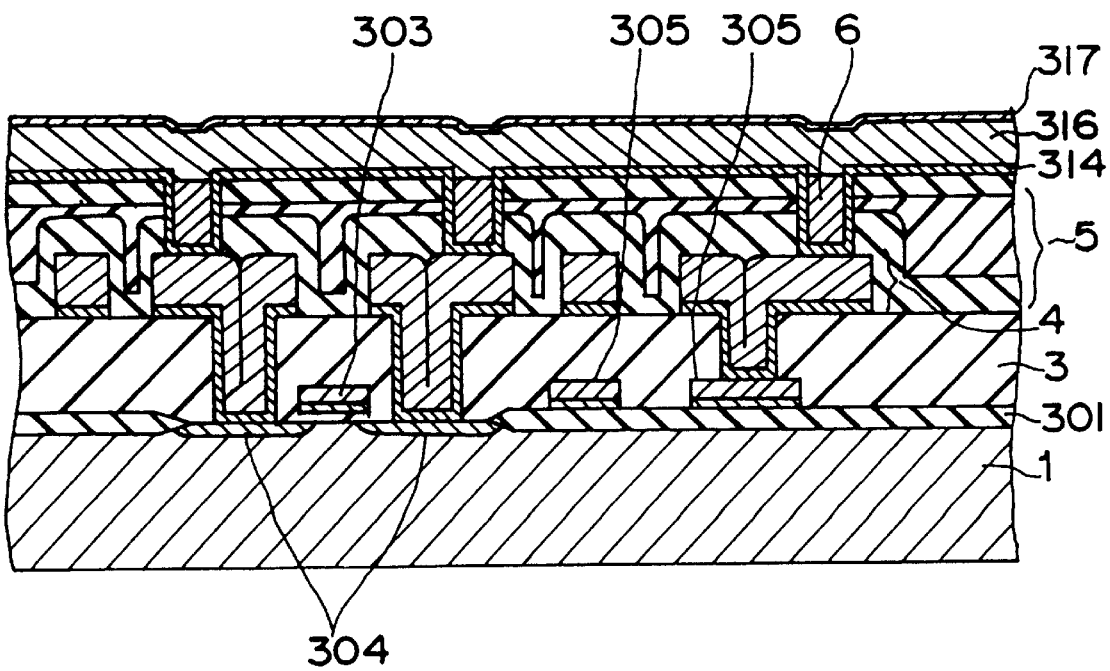
FIG. 25 is an explanatory vertical sectional view of a conventional semiconductor integrated circuit, after an aluminum alloy film and an antireflection film are formed in the step of forming a third stratiform wiring of the semiconductor integrated circuit.
Figure 26:
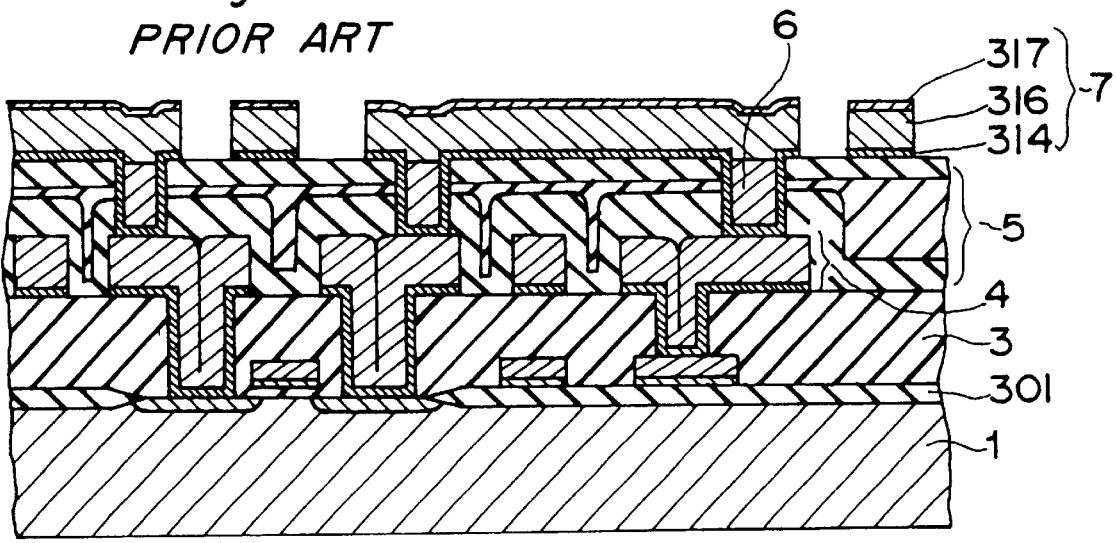
FIG. 26 is an explanatory vertical sectional view of a conventional semiconductor integrated circuit, in the state that the step of forming a third stratiform wiring of the semiconductor integrated circuit has finished.
Figure 27:
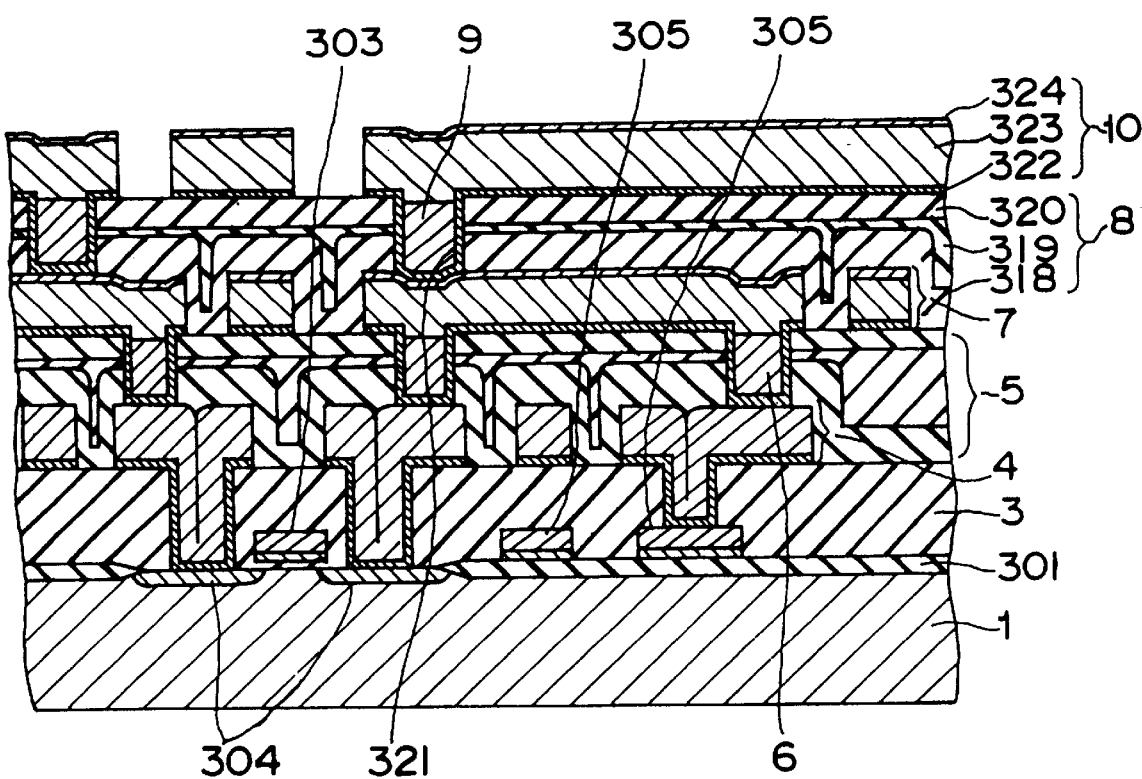
FIG. 27 is an explanatory vertical sectional view of a conventional semiconductor integrated circuit, in the state that the step of forming a fourth stratiform wiring of the semiconductor integrated circuit has finished.
Figure 28:
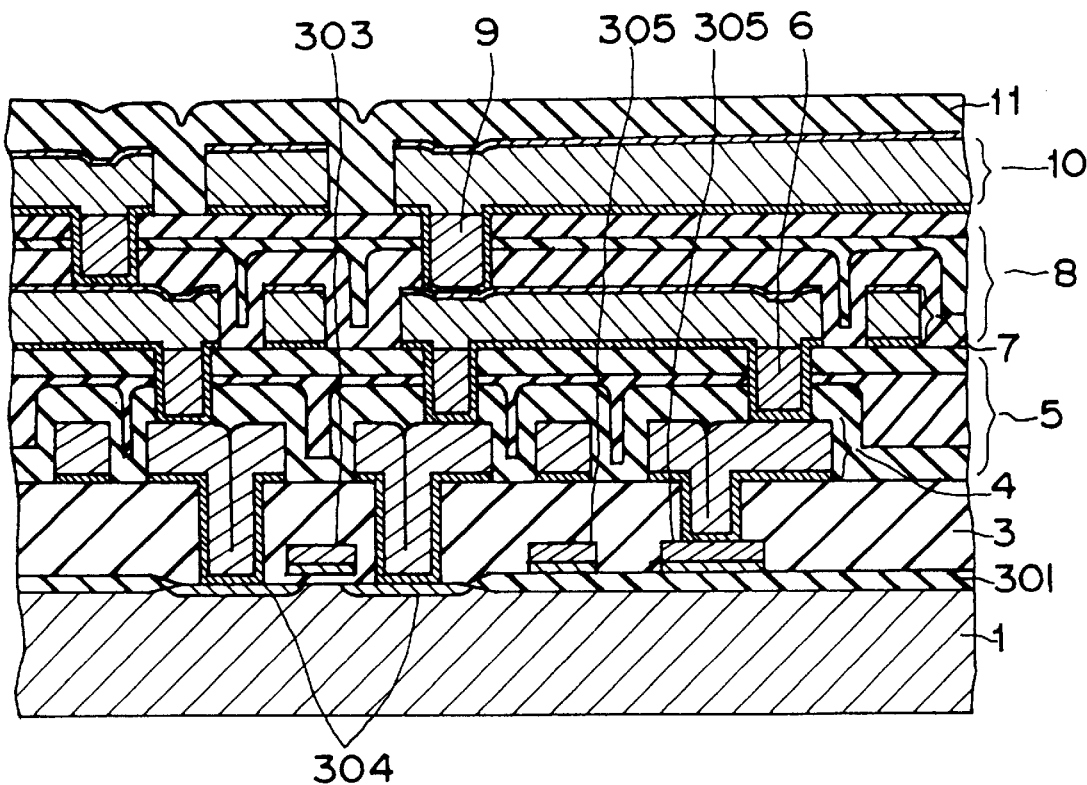
FIG. 28 is a explanatory vertical sectional view of a finished conventional semiconductor integrated circuit.
Figure 29:
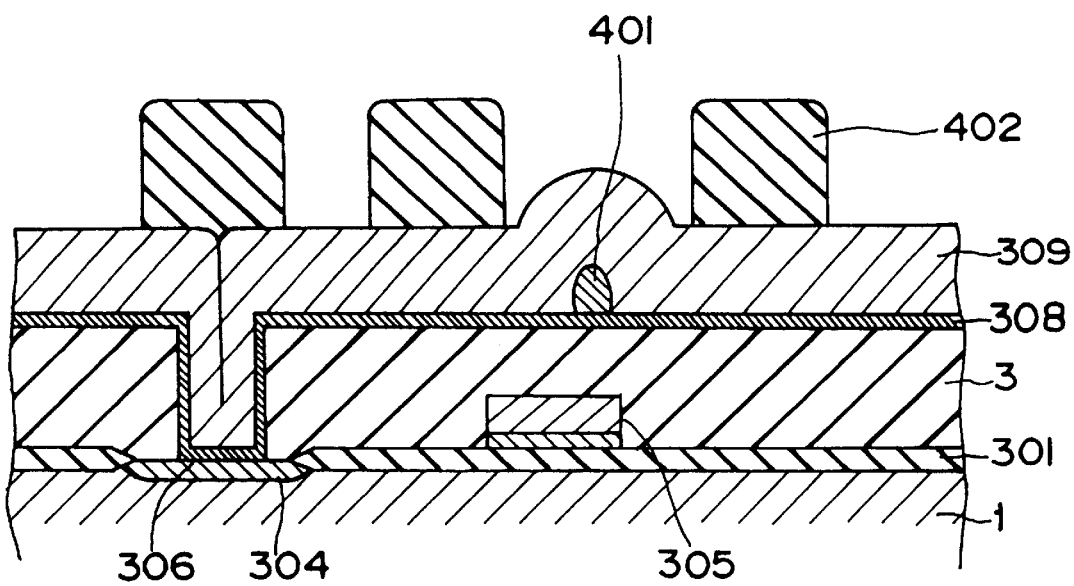
FIG. 29 is an explanatory vertical sectional view of a conventional semiconductor integrated circuit, after a photoresist pattern is formed in the step of forming a second stratiform wiring of the semiconductor integrated circuit.
Figure 30:
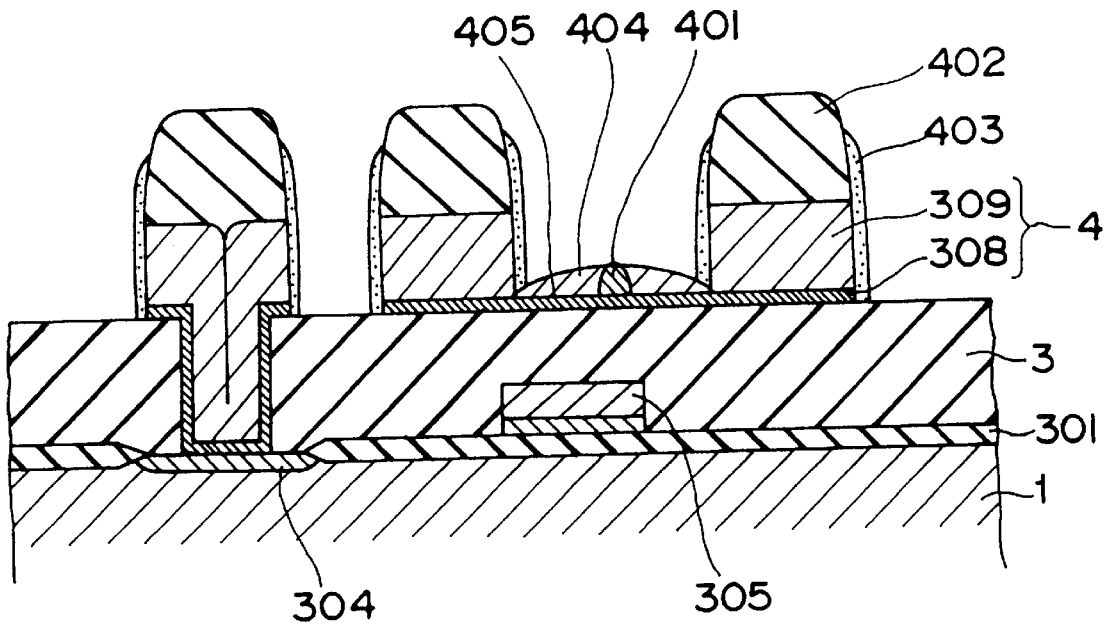
FIG. 30 is an explanatory vertical sectional view of a conventional semiconductor integrated circuit, after a patterning is performed by means of dry etching in the step of forming a second stratiform wiring of the semiconductor integrated circuit.
Figure 31:
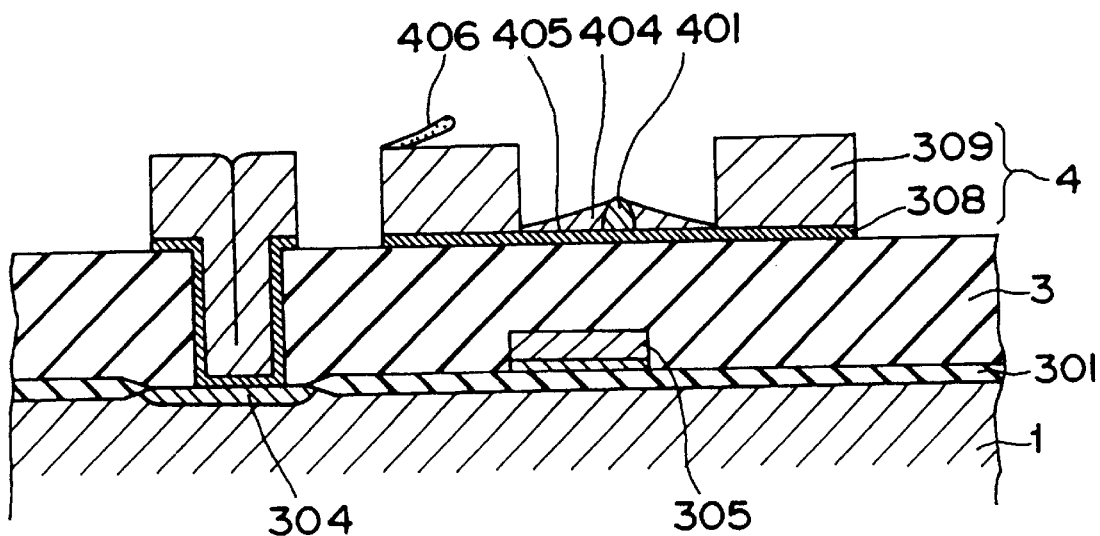
FIG. 31 is an explanatory vertical sectional view of a conventional semiconductor integrated circuit, after a photoresist pattern is removed in the step of forming a second stratiform wiring of the semiconductor integrated circuit.
Figure 32:
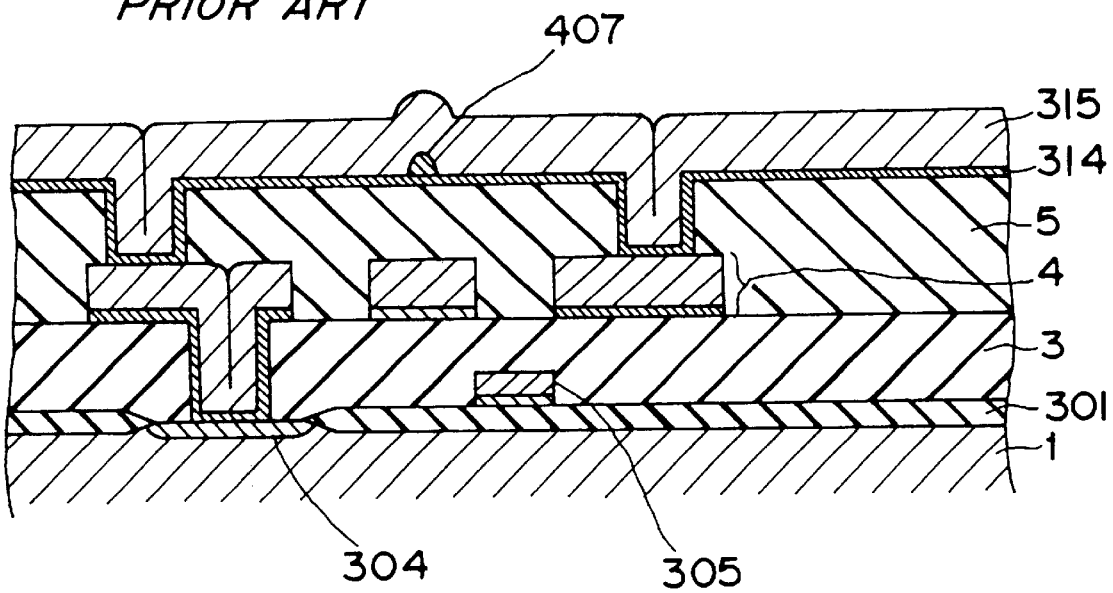
FIG. 32 is an explanatory vertical sectional view of a conventional semiconductor integrated circuit, after a tungsten film is formed in the step of forming plug constants of the semiconductor integrated circuit.
Figure 33:
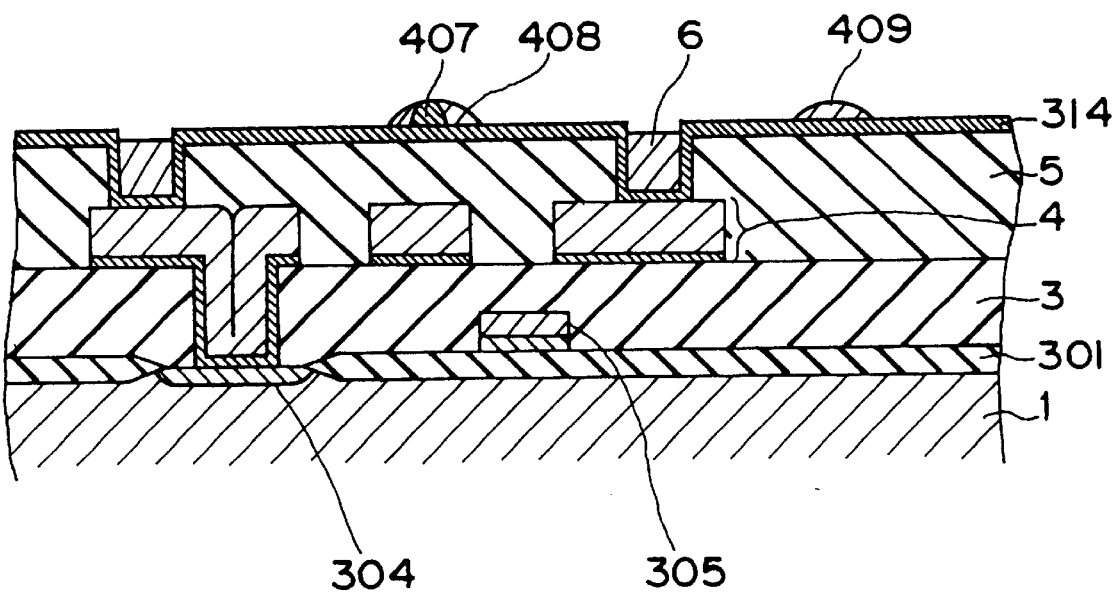
FIG. 33 is an explanatory vertical sectional view of a conventional semiconductor integrated circuit, after a tungsten film is etched back in the step of forming plug constants of the semiconductor integrated circuit.
Figure 34:
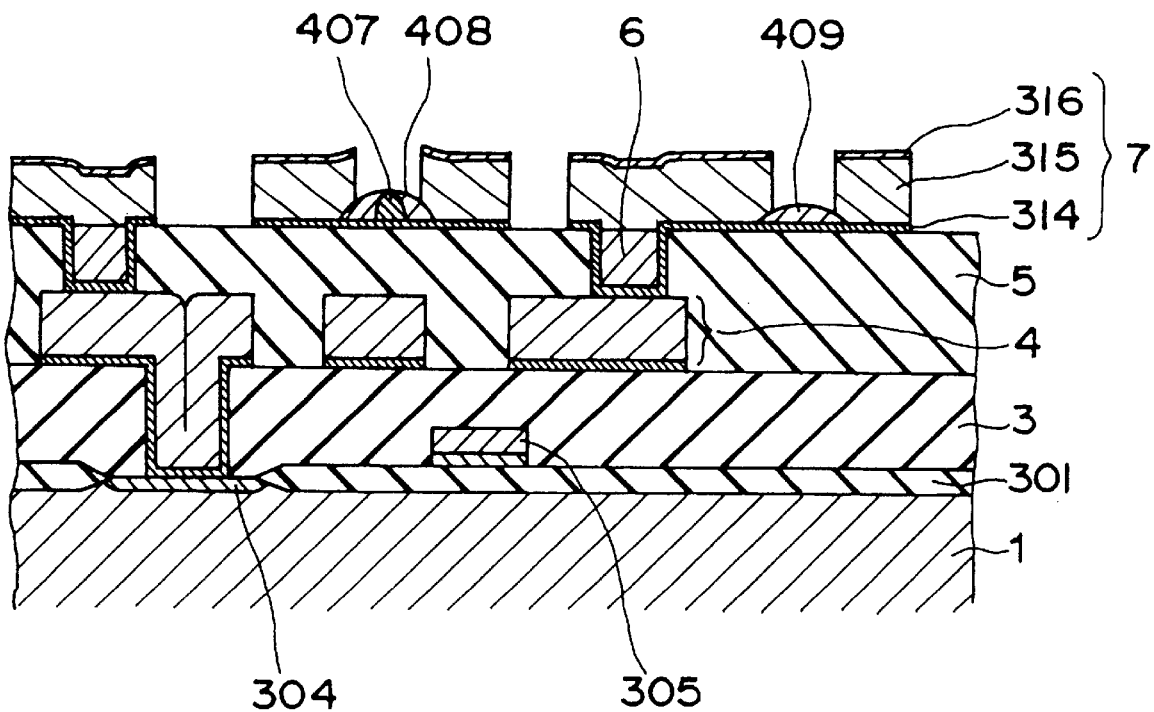
FIG. 34 is an explanatory vertical sectional view of a conventional semiconductor integrated circuit, after a third stratiform wirings formed in the step of forming a third stratiform wiring of the semiconductor integrated circuit.

For example in a process for forming the second stratiform wiring 4 (tungsten wiring) of the four-layer type wiring structure as shown in FIG. 16, let us suppose that a debris 401 adheres on the barrier metal 308, and then the tungsten film 309 is formed on the debris 401 and the barrier metal 308, as shown in FIG. 2.

Figure 3:
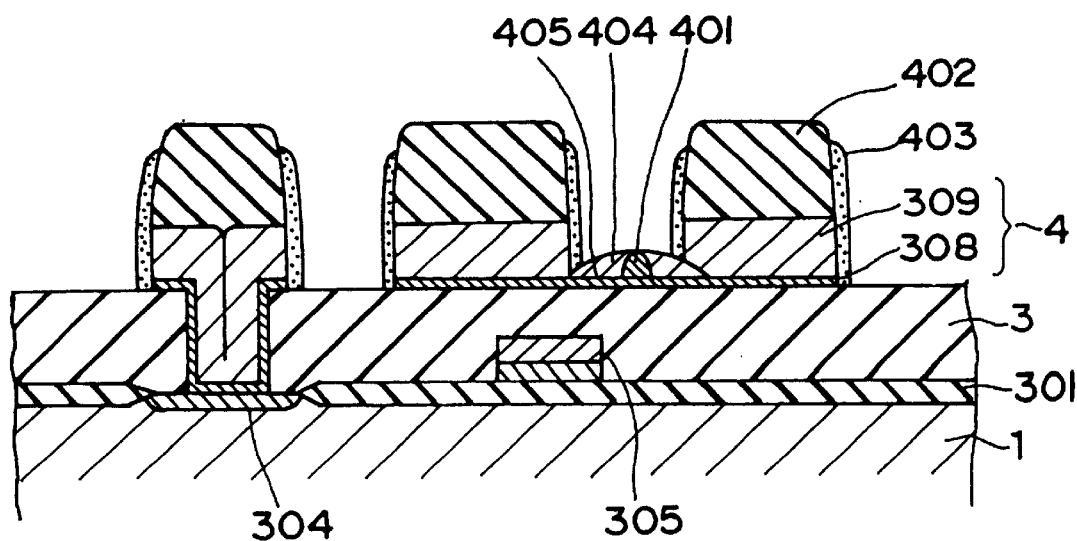
FIG. 3 is an explanatory vertical sectional view of a semiconductor integrated circuit, after patterning is performed by means of dry etching in the step of forming a second stratiform wiring of the semiconductor integrated circuit.

In this case, as shown in FIG. 3, when a photoresist pattern 402 is formed by a photoengraving technique and then subjected to a patterning treatment by a dry etching technique, around the debris 401 there remains a residue 404 of tungsten or a residue 405 of barrier metal film existing thereunder. On the other hand polymers 403 containing tungsten adheres on the side walls of the tungsten wiring 4 or the photo-resist 402 during the dry etching process.

Figure 4:
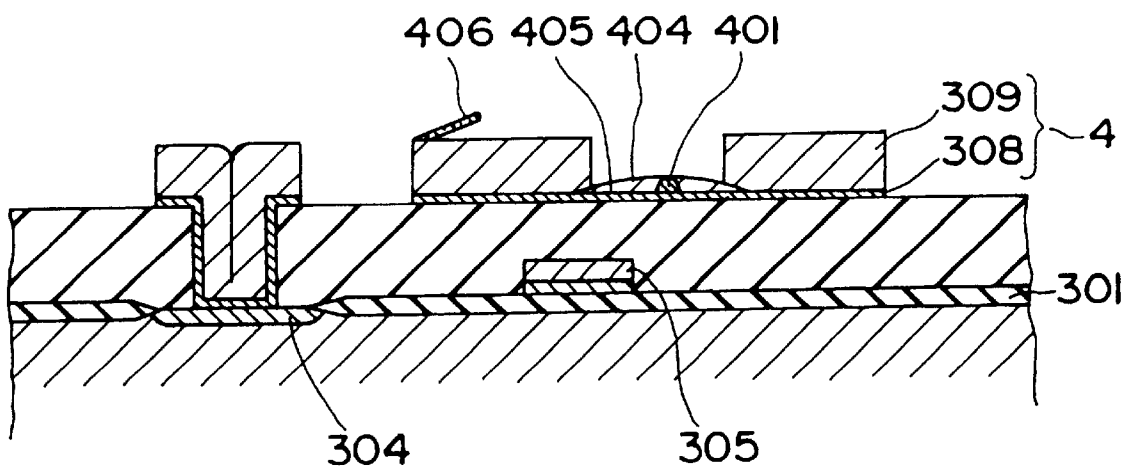
FIG. 4 is an explanatory vertical sectional view of a semiconductor integrated circuit, after a photoresist pattern is removed in the step of forming a second stratiform wiring of the semiconductor integrated circuit.

And then, as shown in FIG. 4, when the photoresist 402 is removed, there remains a polymer 406 which has not removed completely, or among the wirings around the debris 401, there remains the residues 404,405 of the tungsten film or the barrier metal film.

Figure 6:
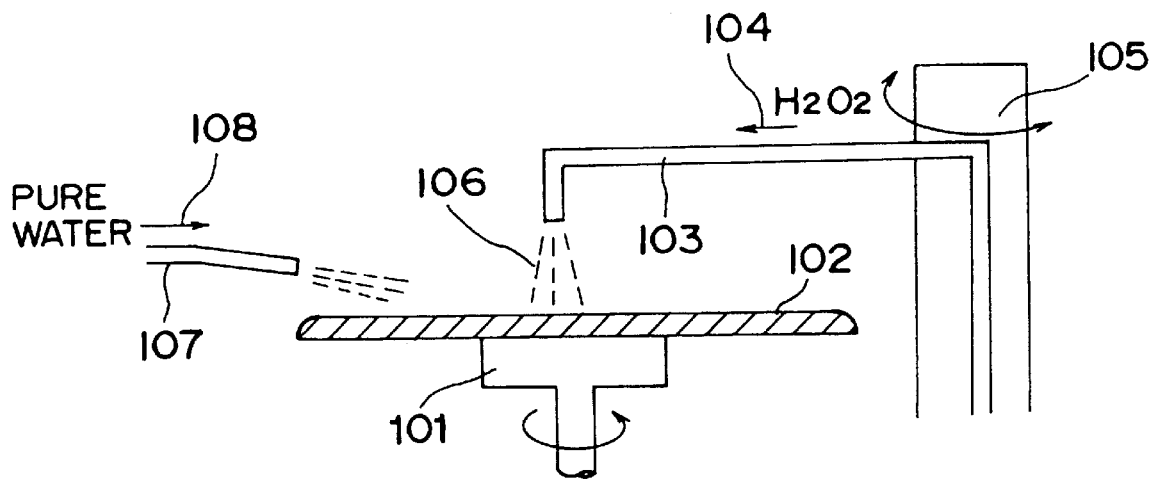
FIG. 6 is a schematic vertical view of an apparatus for manufacturing a semiconductor integrated circuit according to the Embodiment 1 of the present invention.

Hereat the whole surface of the semiconductor integrated circuit 102 under manufacturing process (Hereinafter it is called merely as "semiconductor integrated circuit 102") is washed by a manufacturing apparatus (washing apparatus) as shown in FIG. 6, using for example hydrogen peroxide aqueous solution (30 wt percent).

As shown in FIG. 6, in the washing treatment process, the semiconductor integrated circuit 102 is held by a chuck 101 (rotatable holding means) having an attraction mechanism by suction (not shown). Further, above the semiconductor integrated circuit 102, there are is provided a neutral solution feeding mechanism 103 having a nozzle for feeding neutral solution 104 containing oxidant (hydrogen peroxide aqueous solution of 30 weight percent in this case) onto the semiconductor integrated circuit 102, and a scanning mechanism 105 for scanning the nozzle along the surface of the semiconductor integrated circuit 102, and then the surface of the semiconductor integrated circuit 102 which is rotating is washed by hydrogen peroxide aqueous solution 106 spouting out of the nozzle. Hereat, after the washing process by hydrogen peroxide aqueous solution has finished, pure water 108 is fed onto the surface of the semiconductor integrated circuit 102 by a pure water feeding mechanism 107, so that the surface is rinsed, and then the semiconductor integrated circuit 102 is rotated at high speed thus to be dried by spinning.

Figure 1:
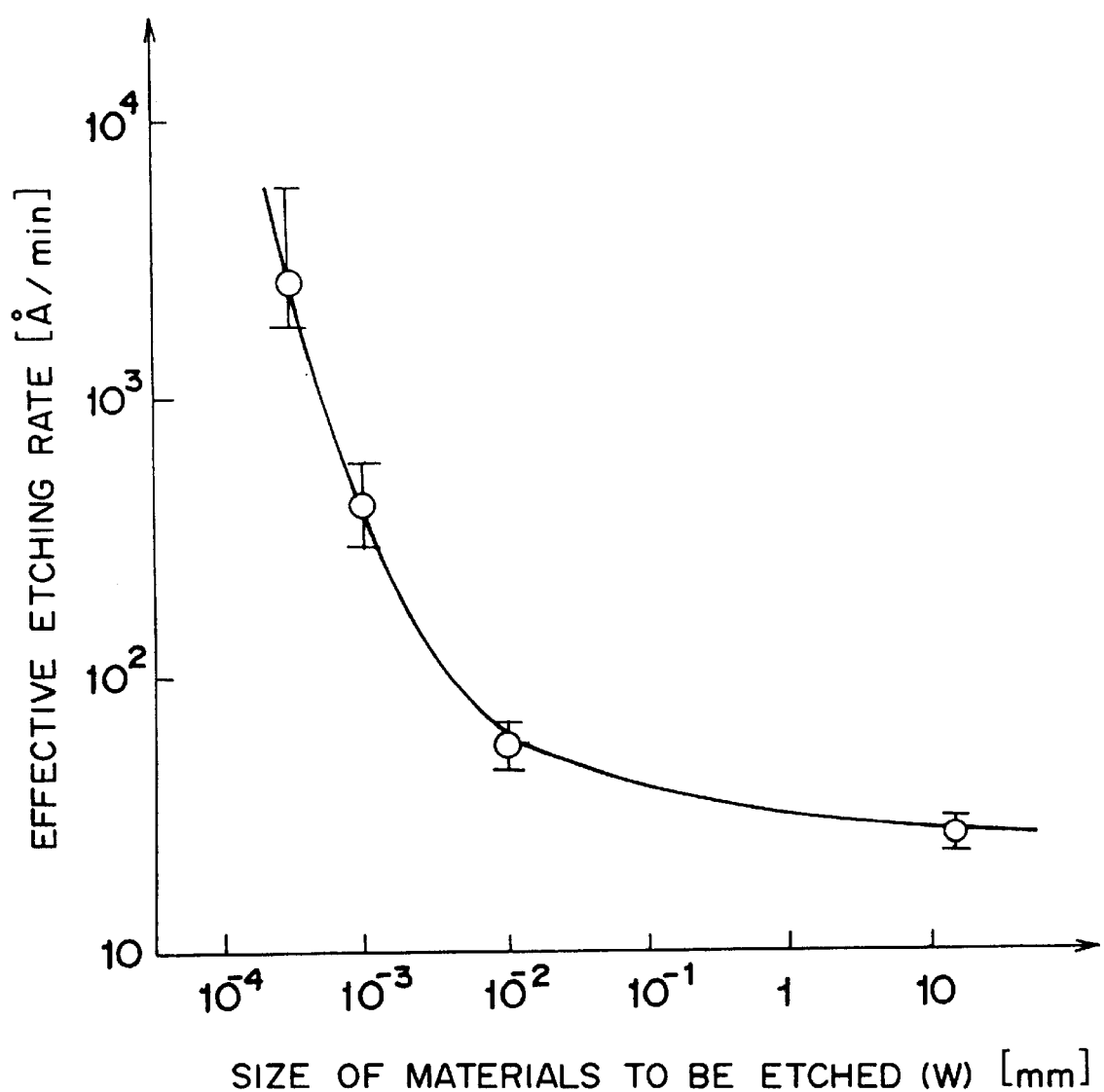
FIG. 1 is a graph representing the relation between size of materials to be etched and effective etching rate of the materials, at the time of performing washing of a semiconductor integrated circuit under manufacturing process by means of neutral solution containing oxidant according to the present invention.
Figure 5:
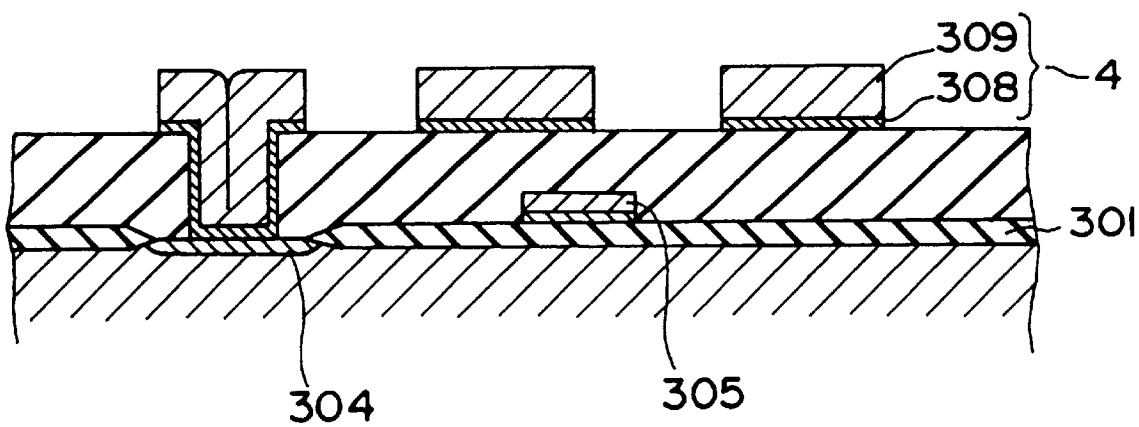
FIG. 5 is an explanatory vertical sectional view of a semiconductor integrated circuit, after a washing treatment using neutral solution containing oxidant according to the present invention is performed, after the step of forming a second stratiform wiring of the semiconductor integrated circuit is finished.

At this time, as shown in FIG. 1, etching rate of the high melting metal film such as tungsten film against hydrogen peroxide aqueous solution depends on the size of materials to be etched remarkably. Therefore, as shown in FIG. 5, it becomes possible that the debris itself 401 or the residues 404,405 created by the debris 401 and the residue 406 of polymer (see FIG. 4) are removed selectively, without causing an extreme etching or a damage in the second stratiform wiring 4 (one of the wiring patterns).

As not shown here, there is provided a temperature control mechanism for maintaining the temperature of the hydrogen peroxide aqueous solution 104,106 within a range of 20 to 40° C., whereby an extreme etching of the wiring element is certainly prevented.

<Embodiment 2>

Figure 7:
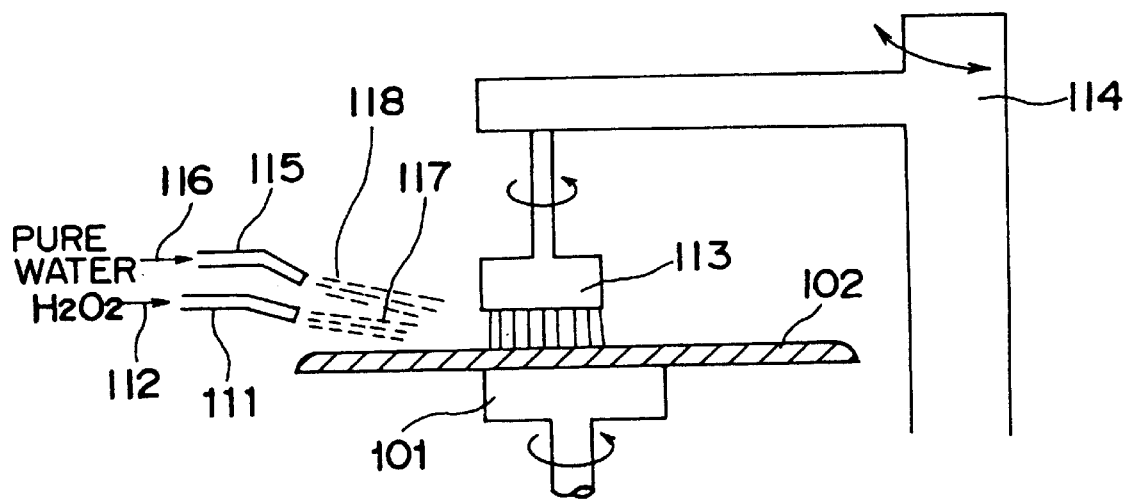
FIG. 7 is a schematic vertical view of an apparatus for manufacturing a semiconductor integrated circuit according to the Embodiment 2 of the present invention.

In the above-mentioned Embodiment 1, though there is used only such washing method that neutral solution containing oxidant as shown in FIG. 6 is blown onto the surface of the semiconductor integrated circuit in order to remove the debris 401 or the residues 404,405 created thereby and the polymer residue 406, a physical washing process using a brush may be combined with the washing, as shown in FIG. 7.

In this case, as shown in FIG. 7, a semiconductor integrated circuit 102 is held by a chuck 101 having an attraction mechanism by suction. Further, above the semiconductor integrated circuit 102, there are provided a neutral solution feeding mechanism 111 having a nozzle for feeding neutral solution 112 containing oxidant (hydrogen peroxide aqueous solution of 30 weight percent in this case) onto the semiconductor integrated circuit 102, a brush 113 having a rotating mechanism for washing physically the surface of the semiconductor integrated circuit 102, and a scanning mechanism 114 for scanning the brush 113 along the surface of the semiconductor integrated circuit 102. And then the surface of the semiconductor integrated circuit 102 which is rotating is fed hydrogen peroxide aqueous solution 117 spouting out of the nozzle thus to be washed by the brush 113 which is rotating and scanning. It is possible for materials of the brush 113 to use nylon or mohair having durability against the neutral solution. Hereat, after the washing process by hydrogen peroxide aqueous solution has finished, pure water 118 is fed onto the surface of the semiconductor integrated circuit 102 by a pure water feeding mechanism 115 for feeding pure water 116, so that the surface is rinsed, and then the semiconductor integrated circuit 102 is rotated at high speed thus to be dried by spinning.

<Embodiment 3>

Figure 8:
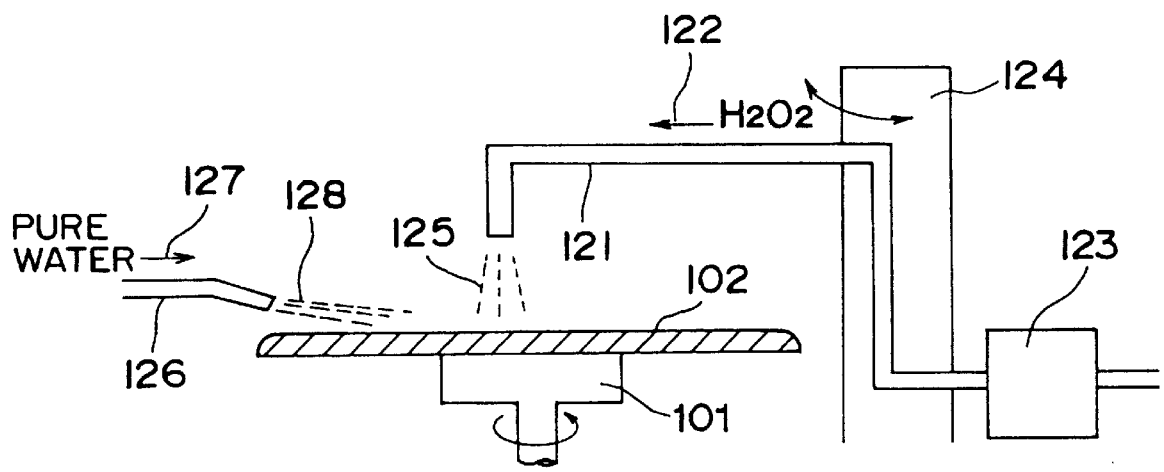
FIG. 8 is a schematic vertical view of an apparatus for manufacturing a semiconductor integrated circuit according to the Embodiment 3 of the present invention.

As well as the Embodiment 2, in which the chemical washing process using the neutral solution containing oxidant is combined to the physical washing process, a washing apparatus or method as shown in FIG. 8, in which the chemical washing process is combined to a physical washing process using high pressure jet stream may be used preferably.

In this case, as shown in FIG. 8, a semiconductor integrated circuit 102 is held by a chuck 101 having an attraction mechanism by suction. Further, around the semiconductor integrated circuit 102, there are provided a pressurizing mechanism 123 for pressurizing neutral solution 122 containing oxidant (hydrogen peroxide aqueous solution of 30 weight percent in this case) to high pressure, a neutral solution feeding mechanism 121 having a nozzle for feeding the neutral solution 122 onto the semiconductor integrated circuit 102, and a scanning mechanism 124 for scanning the neutral solution feeding mechanism 121 along the surface of the semiconductor integrated circuit 102. And then the surface of the semiconductor integrated circuit 102 which is rotating is washed by the jet stream 125 of high pressure hydrogen peroxide aqueous solution spouting out of the nozzle. Hereat, after the washing by hydrogen peroxide aqueous solution has finished, pure water 128 is fed onto the surface of the semiconductor integrated circuit 102 by a pure water feeding mechanism 126 for feeding pure water 127, so that the surface is rinsed, and then the semiconductor integrated circuit 102 is rotated at high speed thus to be dried by spinning.

<Embodiment 4>

Figure 9:
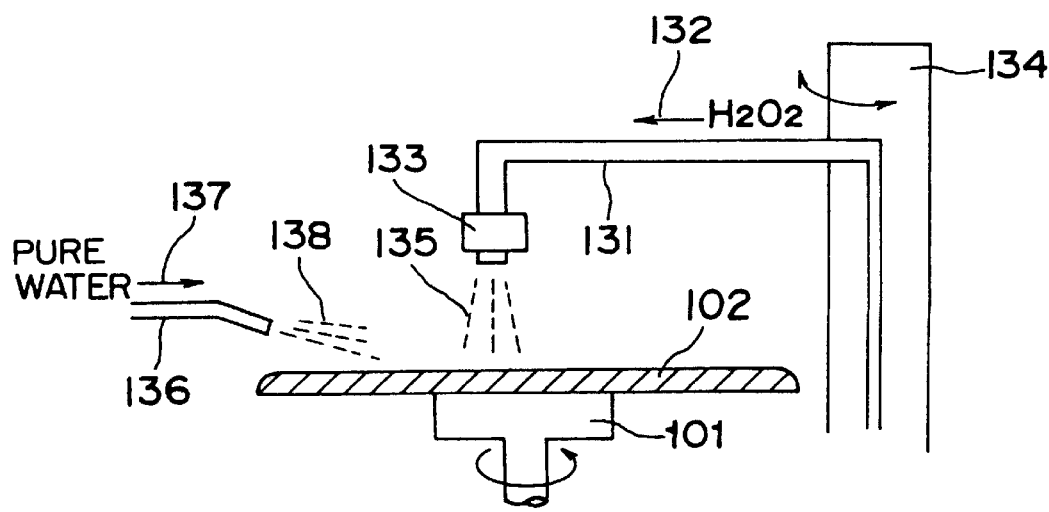
FIG. 9 is a schematic vertical view of an apparatus for manufacturing a semiconductor integrated circuit according to the Embodiment 4 of the present invention.

As well as the Embodiment 2, in which the chemical washing process using the neutral solution containing oxidant is combined to the physical washing process, a washing apparatus or method as shown in FIG. 9, in which the chemical washing process is combined to a physical washing process using ultrasonic wave may be used preferably.

In this case, as shown in FIG. 9, a semiconductor integrated circuit 102 is held by a chuck 101 having an attraction mechanism by suction. Further, above the semiconductor integrated circuit 102, there are provided a neutral solution feeding mechanism 131 having a nozzle for feeding neutral solution 132 containing oxidant (hydrogen peroxide aqueous solution of 30 weight percent in this case) onto the semiconductor integrated circuit 102, an ultrasonic wave adding mechanism 133 for adding ultrasonic wave of frequency of about 1 MHz into the neutral solution in the nozzle, and a scanning mechanism 134 for scanning the neutral solution feeding mechanism 131 along the surface of the semiconductor integrated circuit 102. And then the surface of the semiconductor integrated circuit 102 which is rotating is washed by hydrogen peroxide aqueous solution 135 into which ultrasonic wave is added, spouting out of the nozzle. Hereat, after the washing process by hydrogen peroxide aqueous solution 135 has finished, pure water 138 is fed onto the surface of the semiconductor integrated circuit 102 by a pure water feeding mechanism 136 for feeding pure water 137, so that the surface is rinsed, and then the semiconductor integrated circuit 102 is rotated at high speed thus to be dried by spinning.

<Embodiment 5>

Figure 10:
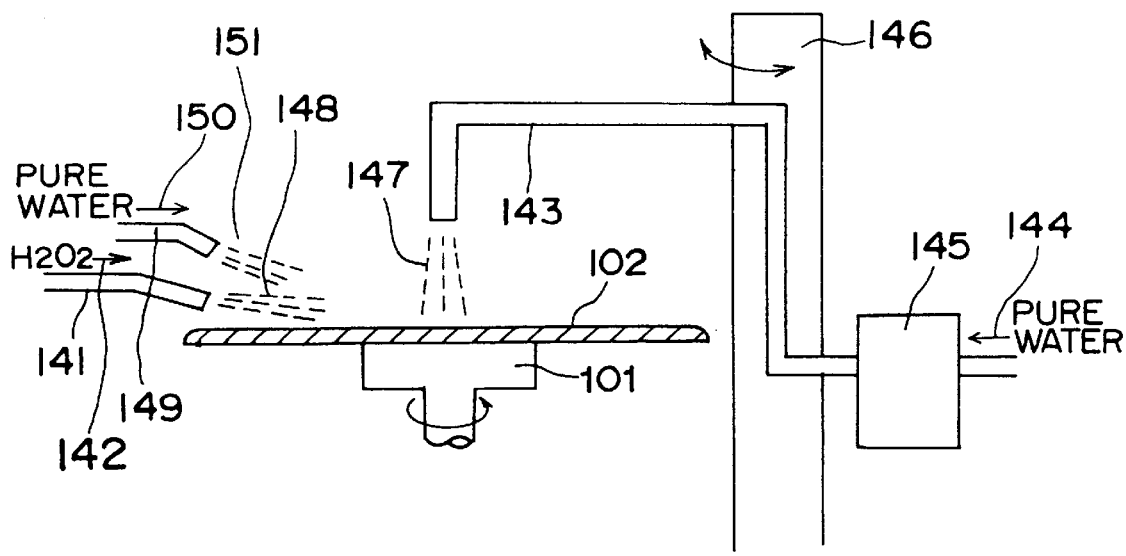
FIG. 10 is a schematic vertical view of an apparatus for manufacturing a semiconductor integrated circuit according to the Embodiment 5 of the present invention.

As well as the Embodiment 2, in which the chemical washing process using the neutral solution containing oxidant is combined to the physical washing, a washing apparatus or method as shown in FIG. 10, in which the chemical washing process is combined to a physical washing using fine water particles or fine ice particles may be used preferably.

As shown in FIG. 10, a semiconductor integrated circuit 102 is held by a chuck 101 having an attraction mechanism by suction. Further, around the semiconductor integrated circuit 102, there are provided a neutral solution feeding mechanism 141 having a nozzle for feeding neutral solution 142 containing oxidant (hydrogen peroxide aqueous solution of 30 weight percent in this case) onto the semiconductor integrated circuit 102, a fine particle creating mechanism 145 for creating fine water particles or fine ice particles from pure water 144, a fine particle feeding mechanism 143 for feeding the fine water particles or the fine ice particles onto the semiconductor integrated circuit 102, and a scanning mechanism 146 for scanning the fine particle feeding mechanism 143 along the surface of the semiconductor integrated circuit 102. And then the surface of the semiconductor integrated circuit 102 which is rotating is washed chemically by hydrogen peroxide aqueous solution 148 fed from the nozzle, and further washed physically by the fine water particles 147 or the fine ice particles 147 spouting out of the nozzle. Hereat, after the washing process by hydrogen peroxide aqueous solution has finished, pure water 151 is poured on the surface of the semiconductor integrated circuit 102 by a pure water feeding mechanism 149 for feeding pure water 150, so that the surface is rinsed, and then the semiconductor integrated circuit 102 is rotated at high speed thus to be dried by spinning.

<Embodiment 6>

In every one of the above-mentioned Embodiments, hydrogen peroxide aqueous solution of about 5 to 40 weight percent is used preferably as neutral solution containing oxidant. However instead of or in addition to these, when ozone aqueous solution is used as the neutral solution, the same operations and effects are achieved. Hereat it is preferable that the concentration of ozone is set within a range of about 1 to 10 mg/liter in view of controllability as well as in the case of using hydrogen peroxide aqueous solution. Such an example is shown in FIG. 11.

Figure 11:
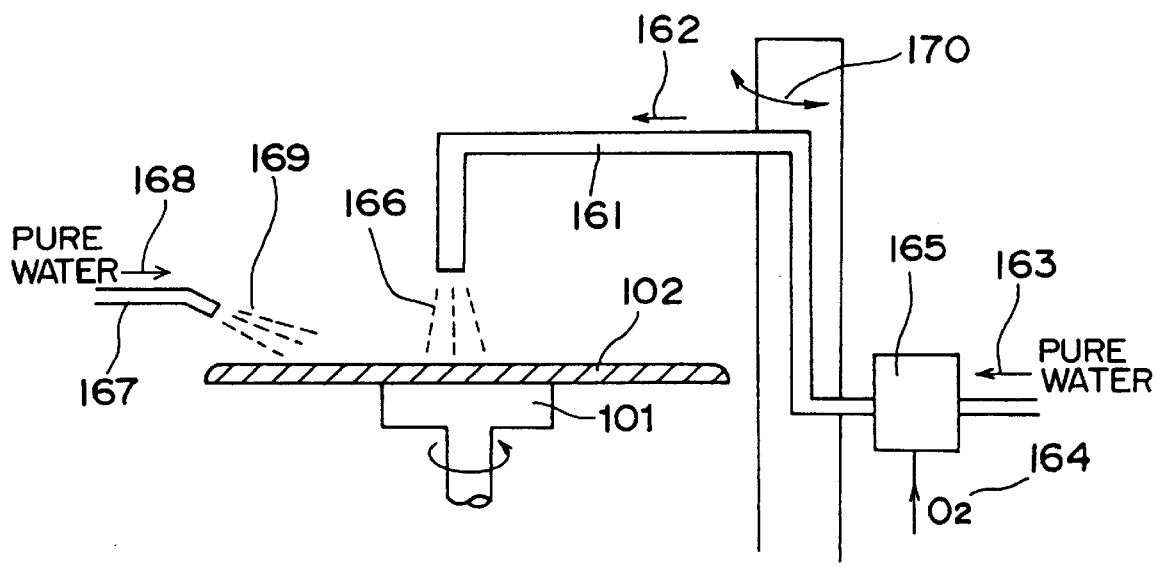
FIG. 11 is a schematic vertical view of an apparatus for manufacturing a semiconductor integrated circuit according to the embodiment 6 of the present invention.

In this case, as shown in FIG. 11, a semiconductor integrated circuit 102 is held by a chuck 101 having an attraction mechanism by suction. Further there are provided an ozone aqueous solution producing mechanism 165 for producing ozone aqueous solution 162 by means of mixing ozone generated from oxygen gas 164 with pure water 163, an ozone aqueous solution feeding mechanism 161 for feeding ozone aqueous solution 162 (for example, ozone aqueous solution of about 5 mg/liter) onto the semiconductor integrated circuit 102, and a scanning mechanism 170 for scanning the ozone aqueous solution feeding mechanism 161 along the surface of the semiconductor integrated circuit 102. And then the surface of the semiconductor integrated circuit 102 which is rotating is washed by ozone aqueous solution 166 spouting from the nozzle. Hereat, after the washing process by ozone aqueous solution has finished, pure water 169 is poured on the surface of the semiconductor integrated circuit 102 by a pure water feeding mechanism 167 for feeding pure water 168, so that the surface is rinsed, and then the semiconductor integrated circuit 102 is rotated at high speed thus to be dried by spinning.

Moreover it is proper that in the washing process using ozone aqueous solution, washing operation or effect is elevated as well as in the case of washing process using hydrogen peroxide aqueous solution, by utilizing additionally a physical washing process using a brush, high pressure jet, ultrasonic wave, fine particles of water or ice, or combination of the above.

<Embodiment 7>

Hereinafter an embodiment in which the washing technique according to the present invention is applied to a plug contact forming process.

Figure 12:
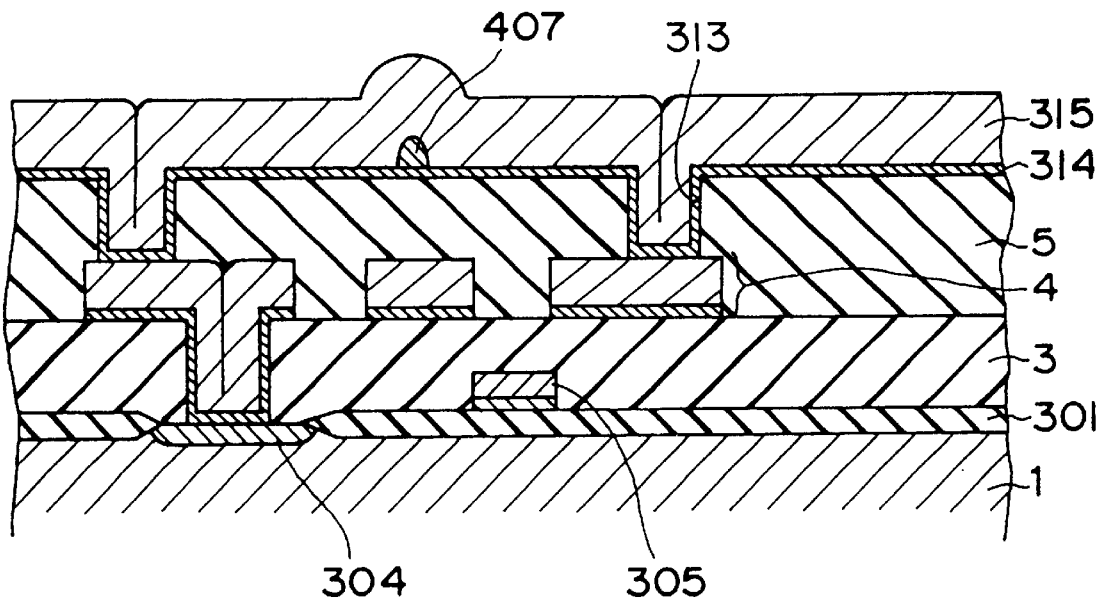
FIG. 12 is an explanatory vertical sectional view of a semiconductor integrated circuit, after a tungsten film is formed in the step of forming plug contacts of the semiconductor integrated circuit.

For example in a process for forming the tungsten plug contacts 6 within the primary via-holes 313 of four-layer type wiring structure as shown in FIG. 16, let us suppose that a debris 407 adheres on the lower film 314, and then a tungsten film 315 is formed by deposition process on the debris 407 and the lower film 314, as shown in FIG. 12.

Figure 13:
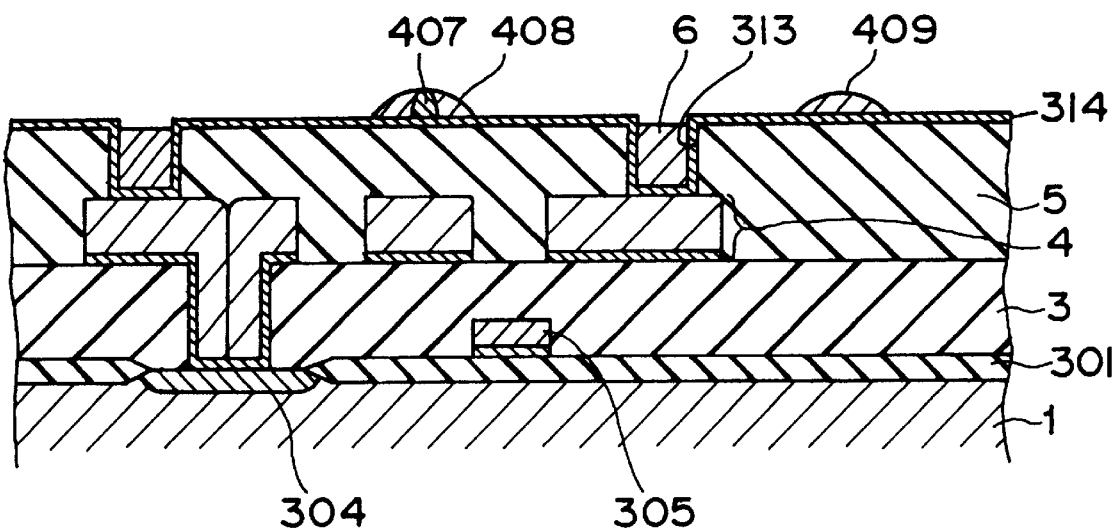
FIG. 13 is an explanatory vertical sectional view of a semiconductor integrated circuit, after a tungsten film is etched back in the step of forming plug contacts of the semiconductor integrated circuit.

In this case, as shown in FIG. 13, when the whole tungsten film is etched back, a tungsten film 408 also remains around the debris 407. Further it is possible that a mere residue 409 of tungsten caused etching back process remains there.

Figure 14:
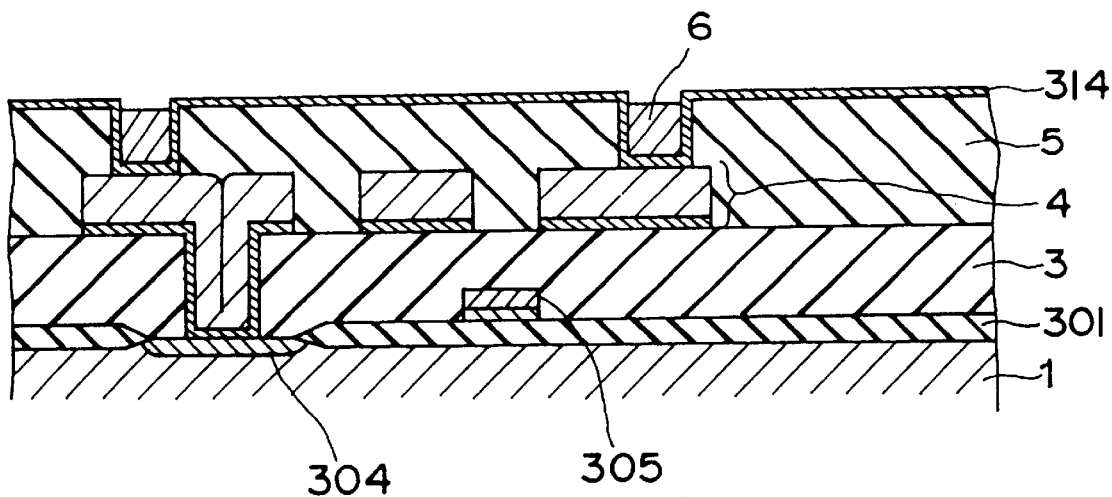
FIG. 14 is an explanatory vertical sectional view of a semiconductor integrated circuit, after a washing treatment using neutral solution containing oxidant according to the present invention is performed, after the step of forming plug contacts of the semiconductor integrated circuit.

After this, for example, there is performed a washing treatment in which a chemical washing process using hydrogen peroxide aqueous solution as neutral solution containing oxidant as in Embodiment 3 and a physical washing process by brushes is combined therewith. Then for the same reason as in Embodiment 1, as shown in FIG. 14, the debris 407 and residues 408,409 (see FIG. 13) are removed selectively without causing an extreme etching or a damage in the tungsten plug contacts 6.

Figure 15:
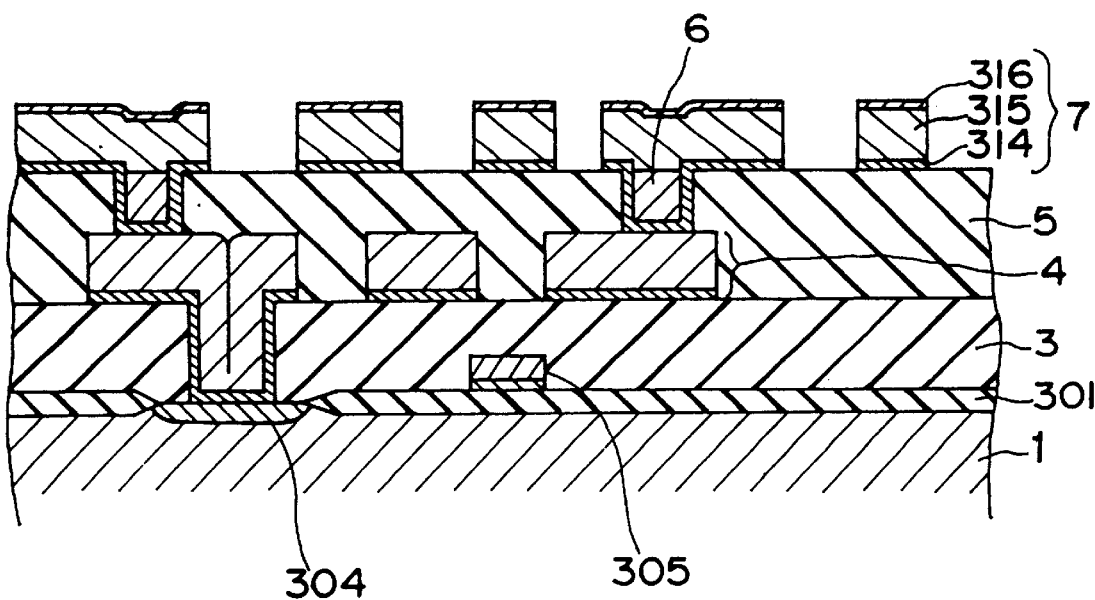
FIG. 15 is an explanatory vertical sectional view of a semiconductor integrated circuit, in the state that a third stratiform layer has been formed, in the step of forming the third stratiform layer of the semiconductor integrated circuit.

Therefore, when the third stratiform wiring 7 (aluminum wiring) is formed by means of a photoengraving technique or a dry etching technique after aluminum alloy film 315 and antireflection film 316 being formed by deposition process on the lower film 314, no short circuits of the wiring occur, as shown in FIG. 15.

Hereat, if the washing method according to Embodiment 2, Embodiment 4, Embodiment 5 or Embodiment 6 is used instead of the above-mentioned washing treatment, the same effect is achieved.

<Embodiment 8>

In every one of the above-mentioned embodiments, there is described mainly a washing techniques for washing (removing) debris or residues during the process of forming wiring patterns or plug contacts comprised of tungsten. However if the washing techniques are applied to a process of forming wiring patterns or plug contacts comprised of another high melting metal such as Mo (molybdenum), Ti (titanium), Ta (tantalum) etc. or compound of silicide, nitride or oxide of the above, the same effect is achieved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for manufacturing a semiconductor integrated circuit comprising:
   rotatable holding means for holding and rotating said semiconductor integrated circuit; and
   neutral solution feeding means for feeding neutral solution containing oxidant onto said semiconductor integrated circuit.

2. The apparatus recited in claim 1, and further comprising scanning means for scanning said neutral solution feeding means along a surface of said semiconductor integrated circuit.

3. The apparatus recited in claim 1, and further comprising pure water feeding means for feeding pure water onto said semiconductor integrated circuit.

4. The apparatus recited in claim 1, wherein said oxidant comprises peroxide.

5. The apparatus recited in claim 4, wherein said peroxide comprises hydrogen peroxide.

6. The apparatus recited in claim 4, wherein said peroxide comprises ozone.

7. The apparatus recited in claim 1, and further comprising temperature control means for maintaining temperature of said neutral solution within a range of 20 to 40° C.

8. An apparatus for manufacturing a semiconductor integrated circuit comprising:
   rotatable holding means for holding and rotating said semiconductor integrated circuit;
   neutral solution feeding means for feeding neutral solution containing oxidant onto said semiconductor integrated circuit; and
   brush rotating means for pushing brushes onto said semiconductor integrated circuit and rotating said brushes.

9. An apparatus for manufacturing a semiconductor integrated circuit comprising:
   rotatable holding means for holding and rotating said semiconductor integrated circuit; and
   neutral solution feeding means for pressurizing neutral solution containing oxidant thus to feed said pressurized neutral solution onto said semiconductor integrated circuit.

10. An apparatus for manufacturing a semiconductor integrated circuit comprising:
    rotatable holding means for holding and rotating said semiconductor integrated circuit;
    neutral solution feeding means for feeding neutral solution containing oxidant onto said semiconductor integrated circuit; and
    ultrasonic wave adding means for adding ultrasonic wave into said neutral solution.

11. An apparatus for manufacturing a semiconductor integrated circuit comprising:
    rotatable holding means for holding and rotating said semiconductor integrated circuit;
    neutral solution feeding means for feeding neutral solution containing oxidant onto said semiconductor integrated circuit; and
    fine particles blowing means for blowing at least one of fine particles water or fine particles of ice onto said semiconductor integrated circuit.

* * * * *